(12) United States Patent
Koudele

(10) Patent No.: US 9,384,799 B2
(45) Date of Patent: Jul. 5, 2016

(54) ADVANCED MEMORY INTERFACES AND METHODS

(71) Applicant: Micron Technology, Inc., Boise, ID (US)

(72) Inventor: Larry J. Koudele, Erie, CO (US)

(73) Assignee: Micron Technology, Inc., Boise, ID (US)

( * ) Notice: Subject to any disclaimer, the term of this patent is extended or adjusted under 35 U.S.C. 154(b) by 385 days.

(21) Appl. No.: 13/848,703

(22) Filed: Mar. 21, 2013

(65) Prior Publication Data

US 2014/0289448 A1 Sep. 25, 2014

(51) Int. Cl.
*G06F 12/02* (2006.01)
*G11C 7/10* (2006.01)
*G11C 7/16* (2006.01)
*G11C 7/22* (2006.01)

(52) U.S. Cl.
CPC ............ *G11C 7/1096* (2013.01); *G11C 7/1066* (2013.01); *G11C 7/1069* (2013.01); *G11C 7/1093* (2013.01); *G11C 7/16* (2013.01); *G11C 7/222* (2013.01); *G11C 2207/107* (2013.01); *G11C 2207/108* (2013.01)

(58) Field of Classification Search
CPC .............. G06F 13/16; G11C 2207/107; G11C 2207/108; G11C 7/1066; G11C 7/1069; G11C 7/1093; G11C 7/1096; G11C 7/16; G11C 7/222
See application file for complete search history.

(56) References Cited

U.S. PATENT DOCUMENTS

2005/0024938 A1* 2/2005 Ono .................... G11C 16/0458
                                                           365/185.14
2010/0246258 A1* 9/2010 Yun et al. ................. 365/185.03
2012/0281479 A1* 11/2012 Kochar et al. ............ 365/185.19

* cited by examiner

*Primary Examiner* — Yong Choe
(74) *Attorney, Agent, or Firm* — Pritzkau Patent Group, LLC

(57) ABSTRACT

Controllers, interfaces, memory devices, methods and systems are disclosed, including a controller configured to interface with a separate memory device and perform an iterative write operation to program a selected memory cell of the memory device to a target state, wherein each iteration of the write operation is configured to successively change a physical state of the selected memory cell. Other controllers, interfaces, memory device, methods and systems are also described, such as those where either a controller or a memory device can throttle a data communication operation, and/or those that utilize customized programming pulses.

27 Claims, 20 Drawing Sheets

ADVANCED MEMORY INTERFACES AND METHODS

BACKGROUND

The present invention is related generally to the field of memory and, more particularly, to advanced memory interfaces and associated methods for use with memory.

While the prior art is replete with examples of interfaces and methods relating to nonvolatile memory (NVM), Applicants recognize that there remains a need for still further improvements in order to enhance the operation of systems which use such memory. The teachings herein provide advanced approaches and improvements for use with nonvolatile memory.

The foregoing examples of the related art and limitations related therewith are intended to be illustrative and not exclusive. Other limitations of the related art will become apparent to those of skill in the art upon a reading of the specification and a study of the drawings.

BRIEF DESCRIPTION OF THE DRAWINGS

Exemplary embodiments are illustrated in referenced figures of the drawings. It is intended that the embodiments and figures disclosed herein are to be illustrative rather than limiting.

FIG. 9b is a flow diagram which illustrates an embodiment of a method for performing the analog read operation of FIG. 9a.

FIG. 10b is a flow diagram which illustrates an embodiment of a method for performing the digital read operation of FIG. 10a.

FIG. 11b is a flow diagram which illustrates an embodiment of a method for performing the analog write operation of FIG. 11a.

FIG. 12b is a flow diagram which illustrates an embodiment of a method for performing the digital write operation of FIG. 12a.

FIG. 13b is a flow diagram which illustrates an embodiment of a method for performing the digital write operation of FIG. 13a.

DETAILED DESCRIPTION

The following description is presented to enable one of ordinary skill in the art to make and use the invention and is provided in the context of a patent application and its requirements. Various modifications to the described embodiments will be readily apparent to those skilled in the art and the generic principles taught herein may be applied to other embodiments. Thus, the present invention is not intended to be limited to the embodiment shown, but is to be accorded the widest scope consistent with the principles and features described herein including modifications and equivalents. It is noted that the drawings are not to scale and are diagrammatic in nature in a way that is thought to best illustrate features of interest. Descriptive terminology may be adopted for purposes of enhancing the reader's understanding, with respect to the various figures, and is in no way intended as being limiting.

Interfaces, controllers, memory devices, systems and methods are described herein. As will be seen, one such controller can include a plurality of ports where each port can itself serve a plurality of memory devices. An interface such as those described herein can be used in embodiments where an iterative write operation is implemented to program a selected memory cell (e.g., a slice of memory cells), as will be discussed in further detail below. It is noted that the term "write" as used herein is interchangeable with the term "program". For example, both can be used to refer to, for example, placing a memory cell(s) in a particular physical state (e.g., a data state). That is, a physical state of a memory cell is selectively variable responsive to, for example, an acoustic, electrical, magnetic, or optical signal. When a charge storage memory cell, such as that commonly referred to as "flash memory cell", is used, an iterative write operation can be used to converge on a target state by successively increasing the magnitude of charge stored by the cell until the stored charge is within some particular range associated with the target state, such as above a particular threshold, such as, for example, 3.5 volts. When the physical state of the memory includes a physical parameter that can be increased or decreased by an iterative write operation, such as, for example, phase change memory, each iteration of the write operation can converge on the target state from above and/or below the target state, as will be seen below.

Figure 1:
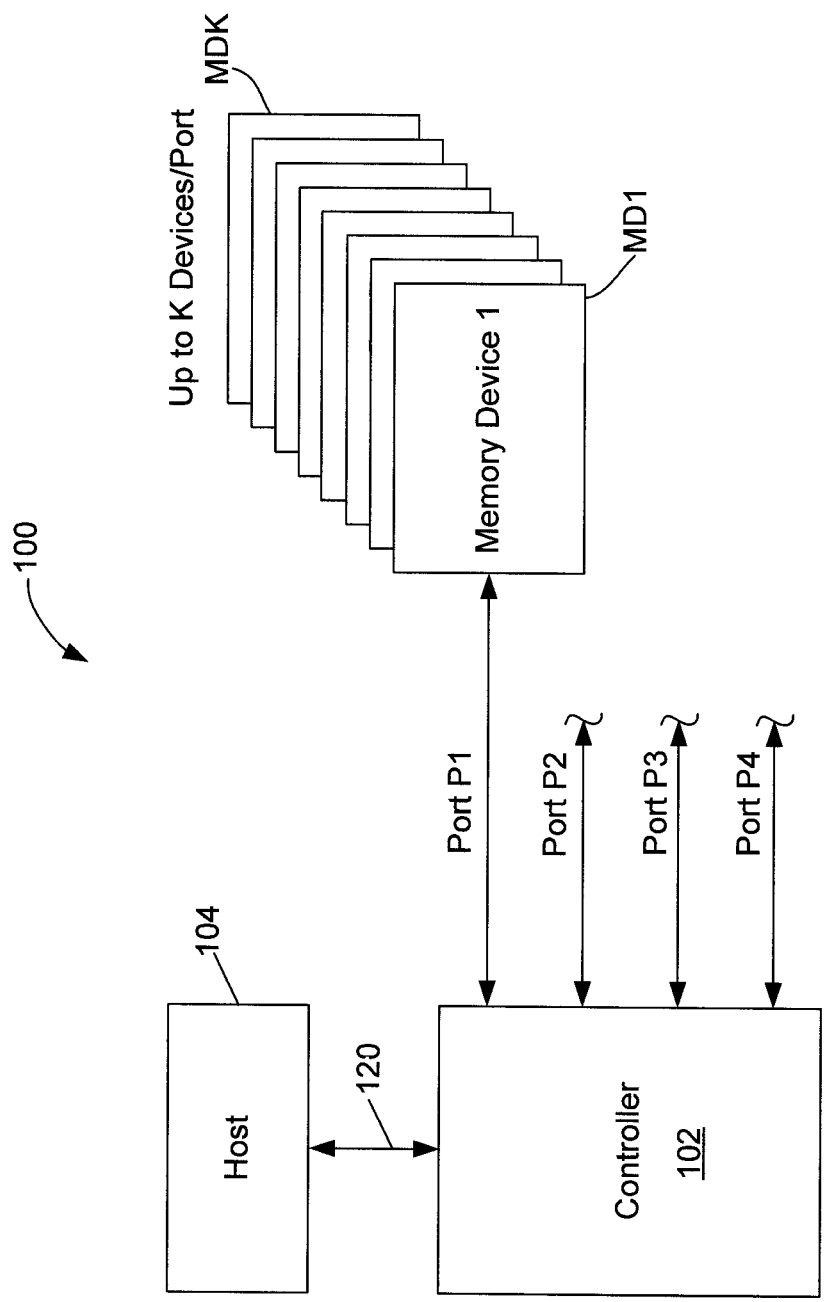
FIG. 1 is a block diagram which illustrates an embodiment of a system that might implement an embodiment of the present disclosure.

Attention is now directed to FIG. 1 which diagrammatically illustrates, using a block diagram, an overall system, generally indicated by the reference number 100, including a controller 102 having 4 ports that are indicated as Ports P1-P4. The controller is in communication with a host device 104 over (e.g., across, on, onto, via, etc.) a host interface 120. Port 1 is interfaced (e.g., connected) to a plurality, K, of memory devices. In the present embodiment, each port can be interfaced with up to eight memory devices designated as MD1-MDK, although other embodiments may interface with less than or more than eight memory devices. In an embodiment with four ports available and where each port can be interfaced with up to eight memory devices, up to 32 memory devices can be interfaced with a single controller. The memory devices can be selected from a wide variety of devices including, but not limited to NAND Flash, PCM (Phase Change Memory), RRAM (Resistive Random Access Memory), and MRAM (Magnetic Random Access Memory). Suitable embodiments of the host interface can include at least one interface that conforms to specifications and standards for generally accepted host interfaces currently known and those yet to be developed. By way of non-limiting example, interfaces that may be used include ATA, USB, Serial ATA (SATA), Secure Digital (SD), Compact Flash (CF), Open NAND Flash Interface (ONFI), Multi-Media Card (MMC), embedded Multi-Media Card (eMMC) and Universal Flash Storage (UFS). Protocols that are associated with these various host interfaces are well-known and are considered to be outside the scope of the present disclosure.

Figure 2:
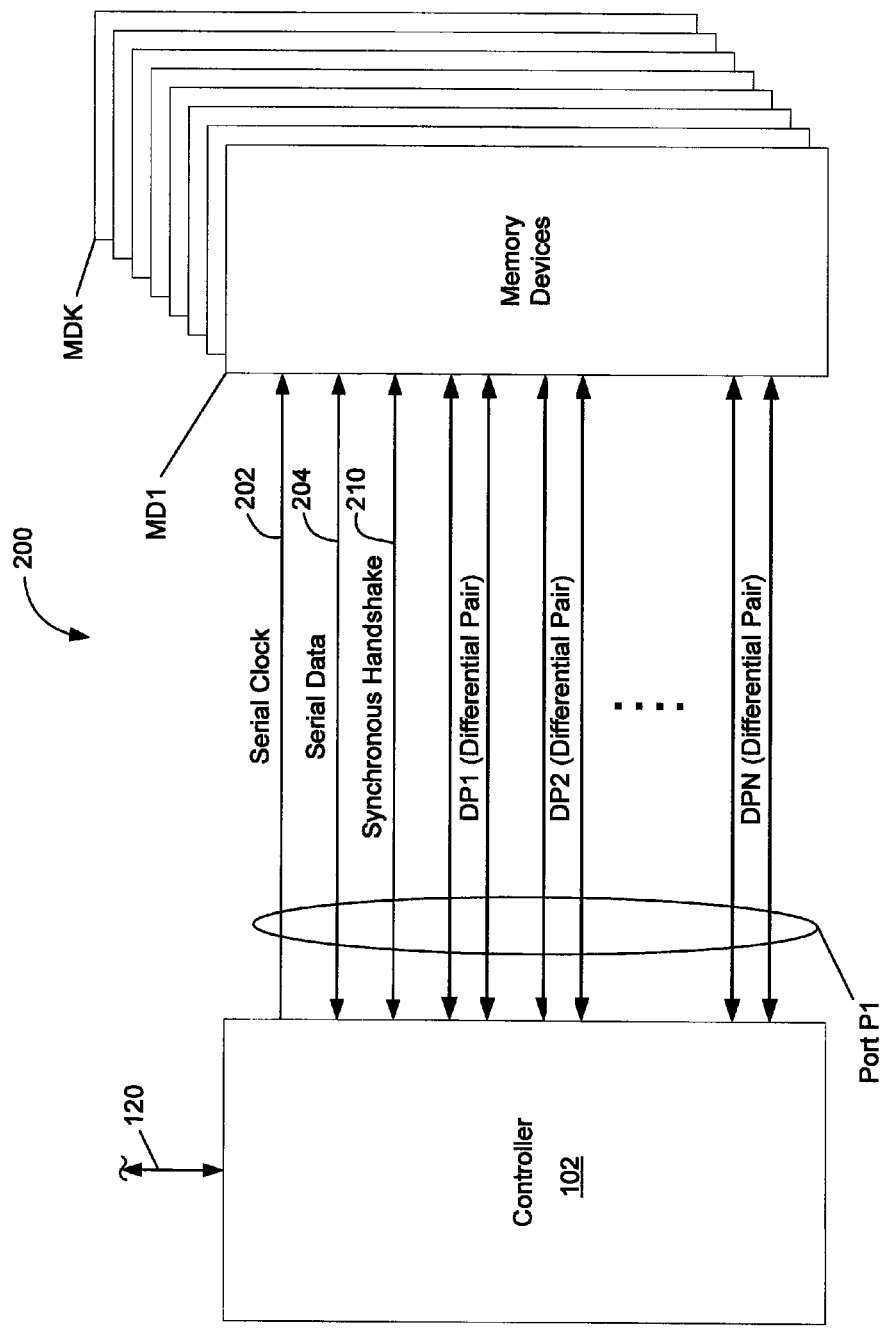
FIG. 2 is a block diagram which illustrates an embodiment of an analog controller to memory device interface which can be used in the system of FIG. 1.

FIG. 2 is a block diagram which illustrates an embodiment of an interface that can be used in the embodiment of FIG. 1, where the interface is generally indicated by the reference number 200 and where port P1 of the controller is interfaced with K memory devices. Individual connections which make up the port interface are shown. It should be appreciated that the illustrated set of connections, with the exception of the bidirectional synchronous handshake line (which may be referred to below as sync HS), is shared by each of the memory devices, accordingly only one set of connections is shown to memory device 1. The other connections include a serial clock 202, which is unidirectional from the controller to the memory device, a serial bidirectional data line 204 between the controller and each memory device, a sync HS line 210 between the controller and each memory device, and N pairs of differential data lines DP1-DPN (which may be referred to as differential pairs). With regard to sync HS line 210, each memory device receives a dedicated sync HS line while the remaining connections are all shared by the memory devices. In the present embodiment, the differential pairs carry analog data signals (which are sometimes referred to herein as analog data and conventionally comprise analog voltages), as will be discussed at one or more appropriate points below. With respect to any of the lines which make up the interface, it should be appreciated that single-ended lines can be used in favor of differential lines, depending on well known design considerations such as, for example, clock speed and/or noise. In the present example, N pairs of differential data lines have been used, although single-ended lines can be used where operational constraints remain within the capability of single-ended lines. Further, different combinations of differential and single-ended lines may be used in the interface, as needed, at least for the reason that different lines may be subject to different data rates. In the present example, the interface is made up of 11 electrical conductors using 4 differential pairs, although this example is not intended as being limiting.

Figure 3:
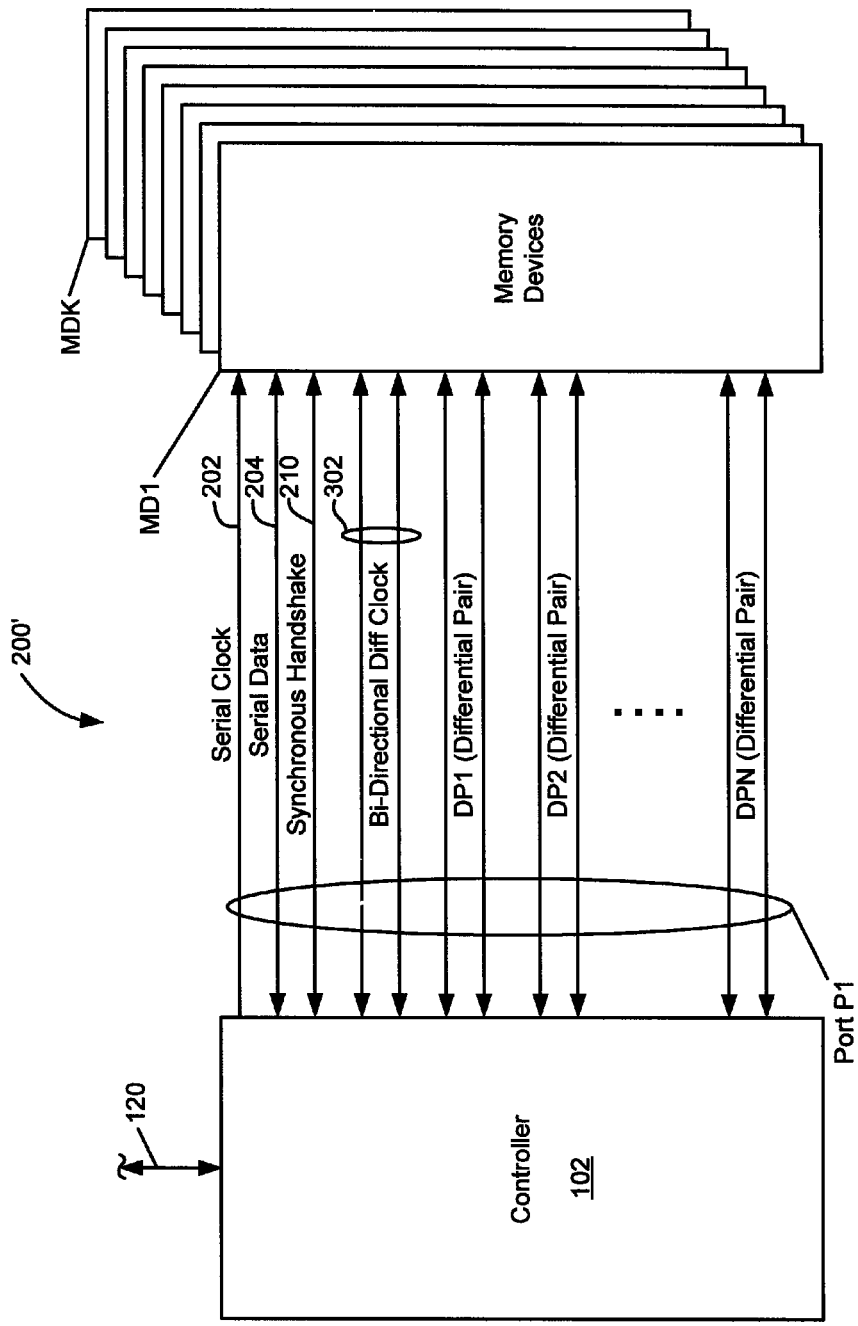
FIG. 3 is a block diagram which illustrates an embodiment of a digital controller to memory device interface which can be used in the system of FIG. 1.

FIG. 3 is a block diagram which illustrates another interface that can be used in the embodiment of FIG. 1, where the interface is generally indicated by the reference number 200' and, where port P1 of the controller is connected to K memory devices. It should be appreciated that FIG. 3 is essentially identical in appearance to FIG. 2, with the exception that a pair of bi-directional differential clock lines 302 is provided for use in clocking the differential pairs. Further, the differential pairs in this embodiment carry digital data signals (which are sometimes referred to herein as digital data). In the present example, the interface is made up of 13 electrical conductors using the aforedescribed 4 differential pairs and by adding the pair of differential clock lines, although this example is not intended as being limiting.

A number of embodiments will be described in detail below with separate hardware block diagrams directed to read operations and write operations. As will be seen, read and write operations can be performed using either a digital interface embodiment (e.g., configuration) or an analog interface embodiment (e.g., configuration). In what is termed an analog embodiment (FIG. 2), digital to analog conversion takes place in the controller such that analog data is communicated (e.g., driven, received, sent, transferred, transmitted, etc.) over the interface between the memory devices and the controller. In what is termed a digital embodiment (FIG. 3), digital to analog conversion takes place in the memory device itself such that digital data is communicated between the controller and the memory devices.

Figure 4:
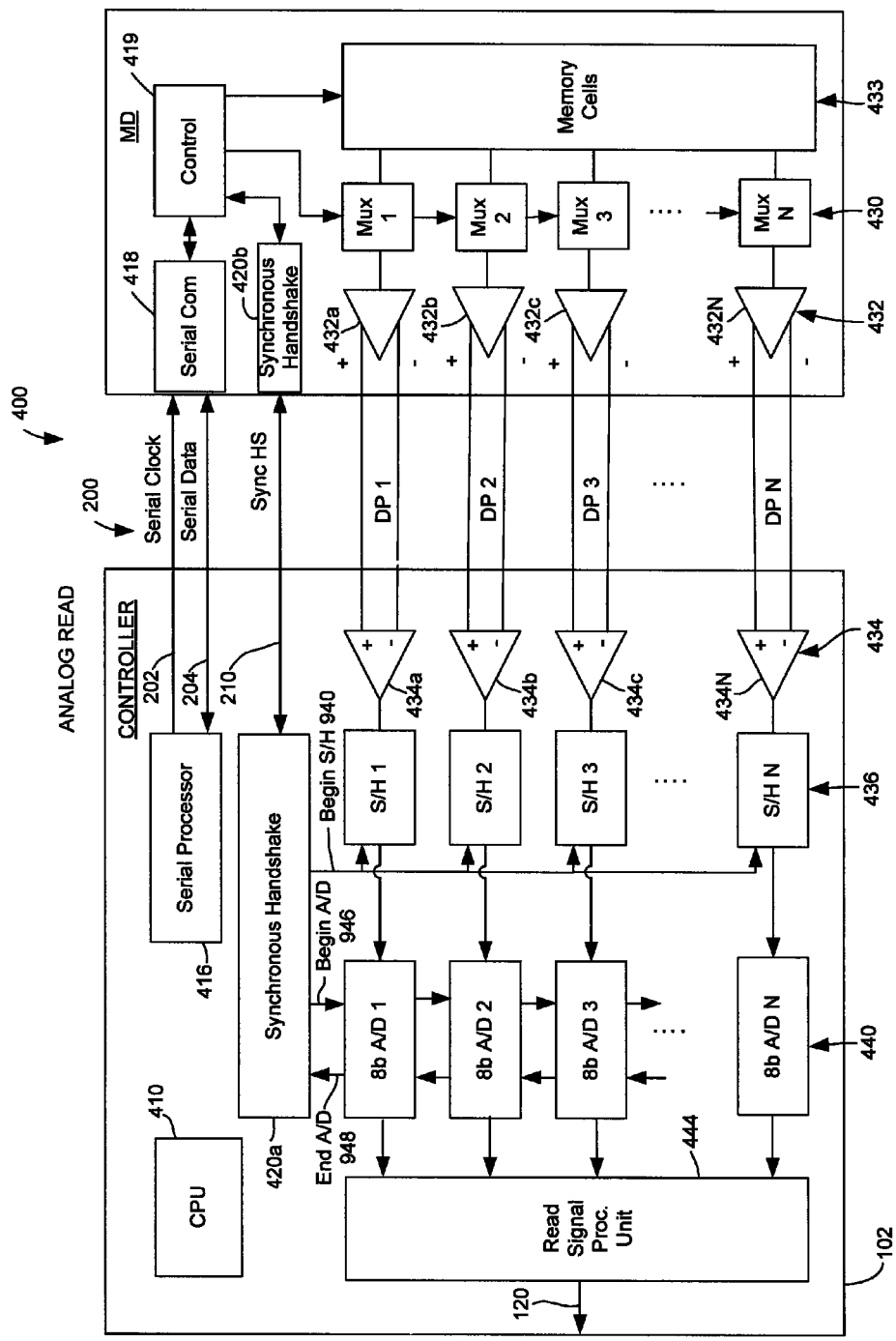
FIG. 4 is a block diagram which illustrates an embodiment of components of the controller of FIG. 2 and an associated memory device for purposes of performing an analog read operation.

Turning now to FIG. 4, attention is directed to a block diagram which illustrates an overall system, generally indicated by the reference number 400, including an embodiment of controller 102 of FIG. 2 and a representative memory device, MD, in a configuration to perform an analog read from the memory device by communicating information from the memory device to the controller as analog data. In this instance, controller 102 and memory device MD can be interfaced by an interface, such as interface 200 shown in FIG. 2, with analog data being communicated over the differential pairs. Accordingly, the information of interest was previously stored in an arrangement of memory cells, such as a respective amount of charge in each of a number of flash memory cells. Overall control of the read operation can be performed from a processor, such as a central processing unit (CPU) 410 that is located in the controller. Because the CPU is interfaced electrically with many components that are shown in the figure, these individual connections have not been shown for purposes of illustrative clarity, but are understood to be present. The controller and each memory device can include a serial processor section 416 and serial communication (serial com) 418 section, respectively, which cooperatively control (e.g., handle) addressing, command and control functions over serial clock line 202 and serial data line 204 (where the serial clock line and the serial data line of the interface is sometimes referred to herein as the "serial interface"). Further control can be provided using a control section 419 as well as synchronous handshake sections 420a and 420b which form respective parts of each of the controller and each memory device, as will be described in further detail at one or more appropriate points below. Control section 419 can be in bidirectional communication with serial com section 418 and sync handshake section 420b. The control section further provides control signals to an arrangement of multiplexers 430 and an array 433 of memory cells. During the subject read operation, multiplexers 430, individually labeled as MUX 1-MUX N, includes one multiplexer associated with each differential pair on the interface between the controller and the memory devices. The multiplexers can receive addressing information from the controller over the serial interface via serial com section 418 and control section 419 which causes each multiplexer to address and thereby access a selected memory cell(s) within the array of memory cells. In this way, for N differential pairs, N memory cells can be accessed simultaneously. Again, as noted above, it should be appreciated that any suitable number of differential pairs can be used and the use of four differential pairs in the present example is not intended as limiting. The access of these N memory cells may be referred to hereinafter as a "slice" of memory cells. While the discussions herein are framed in terms of slices, by way of non-limiting example, it should be appreciated that N memory cells can represent any suitable selection of memory cells including but not limited to wordlines and pages. Accordingly, addressing can be performed so as to enable a sequential access of the entire array of memory cells in a slice by slice manner. It should be appreciated that there are a wide variety of addressing schemes that may be used to perform such a slice by slice access and that whatever approach is applied to read operations can generally be applied to write operations. When the memory cells of each slice are addressed in a manner that increments the address of each successive (e.g., sequential) memory cell of a slice by a value of one, the address of the last memory cell of any given slice will be the address of the first memory cell of the slice plus N. The address of the first memory cell of the next slice, based on the address of the first memory cell of a current slice, is increased by N+1. Once the multiplexer arrangement has been caused to appropriately address a memory slice, an arrangement of differential output amplifiers 432a-432N, which may be referred to collectively as differential amplifier arrangement 432, reads the state of each memory cell of the current one of the slices that is being selectively addressed, which in an embodiment including charge storage memory cells, can involve reading an analog voltage. The differential buffer amplifiers provide these voltages on differential pairs 1-N for communication over the interface to the controller.

Still referring to FIG. 4, at the controller, an arrangement of differential amplifiers 434a-434N, which may be referred to collectively as differential amplifiers 434 receives the signals from the differential pairs and provides (e.g., produces, generates, outputs, etc.) single-ended outputs to an arrangement of sample and hold circuits 436, individually designated as S/H 1-S/H N, to latch and hold the signals provided from amplifier arrangement 434. An arrangement of analog to digital converters 440, individually designated as A/D 1-A/D N, is used to read the signals from the sample and hold circuits, respectively. In an embodiment, sample and hold circuits 436 can themselves be differential such that the differential amplifiers are incorporated therein. A read signal processing unit 444 then receives the digital read signals from the analog to digital converters and provides user data, such as by converting the digital read signals. This can include, by way of non-limiting example, decoding a convolutional code through the use of a Viterbi decoder and/or decoding a Reed Solomon code. In the present embodiment, the use of eight bit analog to digital converters has been shown, but these converters may be of any suitable width, depending on a particular application. Additional details with respect to the operation of the illustrated components will be provided at appropriate points below.

Figure 5:
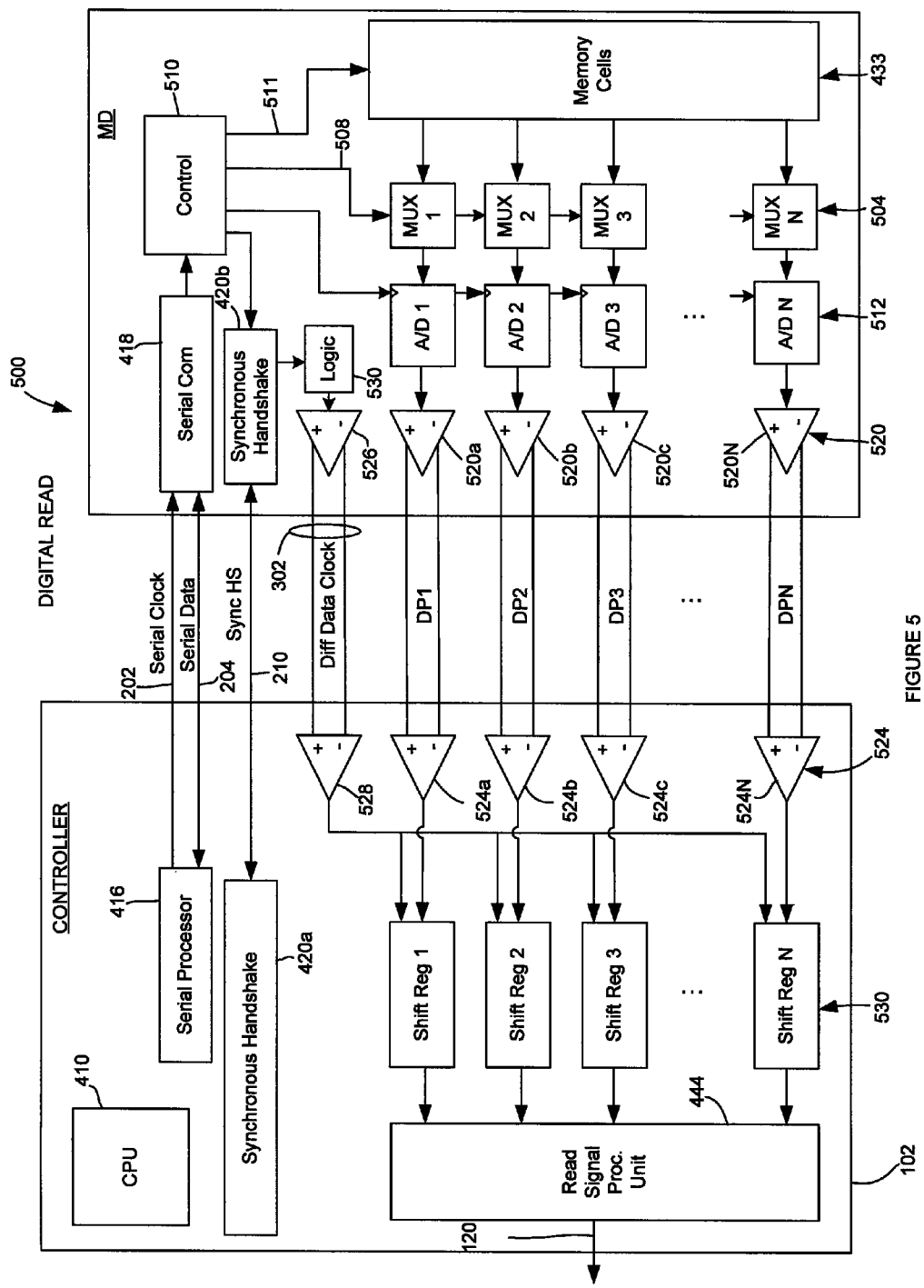
FIG. 5 is a block diagram which illustrates an embodiment of components of the controller of FIG. 3 and an associated memory device for purposes of performing a digital read operation.

Turning to FIG. 5, attention is directed to a block diagram which illustrates an overall system, generally indicated by the reference number 500, including an embodiment of the controller 102 of FIG. 3 and a representative memory device, MD, in a configuration to perform a digital read by communicating information from the memory device to the controller as digital data. In this instance, controller 102 and memory device MD can be interfaced by an interface such as interface 200' shown in FIG. 3, with digital data being communicated over the differential pairs. In each memory device, an arrangement (e.g., a set) of multiplexers 504, individually designated as MUX-1 to MUX-N, provide for selection of a memory slice within array 433 of memory cells responsive to (e.g., based on, when, as a result of, etc.) addressing. The select signals for these multiplexers can be provided by (e.g., originate from), for example, on a line 508 from a control (e.g., logic) section 510 which is considered as being readily configurable by one having ordinary skill in the art with this overall disclosure in hand. Another line 511 from control section 510 to memory array 433 is provided. Accordingly, slice addressing can be performed by controller 102 using line 508 and memory addressing can be performed by controller 102 using line 511. Thus, addressing can be performed by controller 102 in any suitable manner, for example, by addressing successive increments of memory cells in memory array 433 and/or by addressing successive pages. Additional control lines that are not individually designated extend to sync handshake section 420b, and an array of A/D converters 512. Serial com section 418 can provide control signals to analog to digital converters 512, individually designated as A/D 1-N, by interpreting control and addressing information that is received from serial com section 418 and provided by controller 102. Control section 510 causes A/D converters 512 to convert the voltage that is presented by each memory cell of a current slice, responsive to stable availability of the voltages from the multiplexers. A/D converters 512 can be of any suitable width, n, in view of a particular application of interest. It is noted that an arrangement of differential amplifiers 520a-520N, which may be referred to collectively as differential amplifiers 520, is provided to drive the digital data over the differential pairs at the memory device and an arrangement of differential receivers 524a-524N, which may be referred to collectively as differential receivers 524, can be provided to receive the digital data from the differential pairs on the controller side. It should be appreciated that single-ended lines can be used in other embodiments as opposed to differential pairs based, for example, on design considerations, as discussed above. Accordingly, each bit of 1-n bits is successively communicated across the differential pairs and latched into an arrangement of shift registers 530, individually designated as Shift Reg 1-Shift Reg N. The communication can be controlled, for example, responsive to signals on differential clock lines 302 that are driven over the clock lines by a differential driver 526 and received at the controller by a differential receiver 528. The clock signals can be provided (e.g., generated) by synchronous handshake section 420a and provided to differential driver 526 by a logic section 530 which synchronizes the operation of the Sync HS line and the clock. It should be appreciated that single-ended lines can be used in other embodiments for the data clock, as opposed to a differential pair based, for example, on design considerations, as discussed above. The successive communication can utilize a starting address to identify the location of the first bit and then controller 102 can automatically increment that address to access the remaining bits up to bit n. Read signal processing unit 444 then performs any necessary tasks such as, for example, decoding in order to provide (e.g., recover) user data. As described above, Viterbi decoding and Reed Solomon decoding may be among these tasks.

Figure 6:
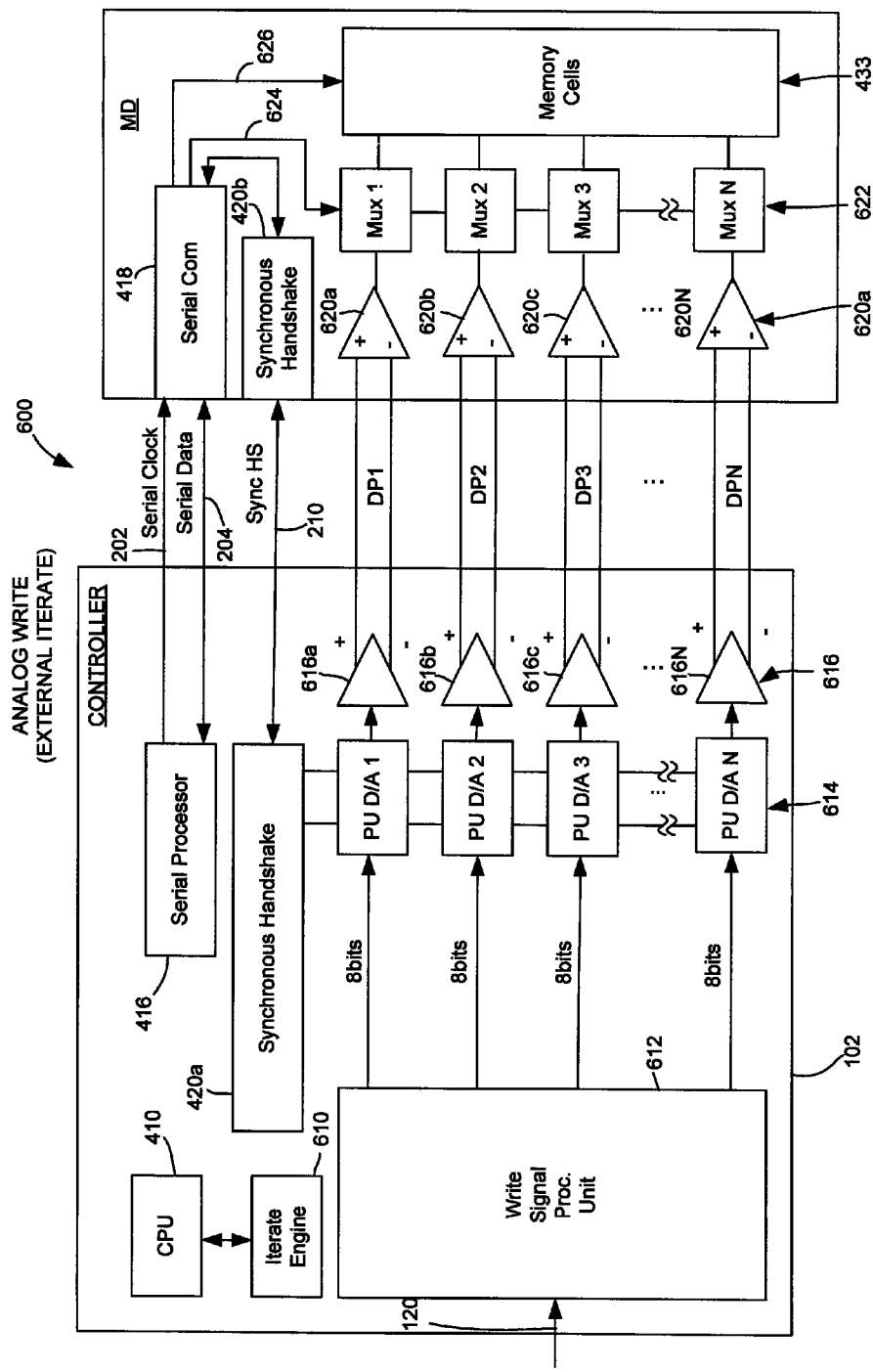
FIG. 6 is a block diagram which illustrates an embodiment of components of the controller of FIG. 2 and an associated memory device for purposes of performing an analog write operation using external iteration.

Referring to FIG. 6, a block diagram is shown which illustrates an overall system, generally indicated by the reference number 600, including an embodiment of the controller 102 of FIG. 2 and a representative memory device MD, in a configuration for performing an analog write from the controller to the memory device by communicating information over the interface as analog data (where the information is provided (e.g. originates) based on incoming user data). In this instance, controller 102 and memory device MD can be interfaced by an interface such as interface 200 shown in FIG. 2, with analog data being communicated over the differential pairs. The overall write operation can be performed under the control of a processing arrangement that is made up of CPU 410 in communication with an iterate engine 610, which will be described in detail below. As discussed above, connections between the processing arrangement and the various components are not shown for purposes of illustrative clarity but are understood to be present. The user data that is to be written to a particular cell of each one of the memory devices is received by a write signal processing unit and subjected to any encoding that is desired such as, for example, convolutional encoding, Reed Solomon encoding and/or other operations. In the present embodiment, the encoded information can be communicated to an arrangement of pulse unit digital to analog converters 614, individually designated as PU A/D 1-PU A/D N, in the form of bytes. In an embodiment, eight bit lines can extend from the write signal processing unit to each pulse unit digital to analog converter, although serial communication of these bits can be provided in an embodiment. In an embodiment, a programming arrangement such as the pulse unit digital to analog converters, once having a byte of information available and responsive to drive signals from synchronous handshake section 420a, each provide (e.g., output) a signal (e.g., a programming pulse) to an associated one of an arrangement of differential analog drivers 616a-616N, which may be referred to collectively as drivers 616, that drive differential pairs DP1-DPN. Based on a particular byte of write information, it should be appreciated that each one of these programming (e.g., drive) pulses can be configured (e.g., customized) in a manner that is described below, having a pulse shape (which includes but is not limited to, leading edge rise time, width, amplitude, and trailing edge fall time), that is intended to cause a particular change in a physical state of a memory cell (e.g., the magnitude of charge stored by the cell, the magnitude of the resistance of the cell, or the like), depending on what type of memory device is used. This shape is responsive to bit(s) of information to be stored in the particular memory cell, so it may be of various forms, depending on the type of memory cell accessed. For example in a NAND device, the actual information is charge (or absence thereof) stored in a charge storage structure (e.g., a floating gate or charge trap), which is interpreted as the Vt of the cell. As another example, it can be resistance in an RRAM device or Phase Change cell. Accordingly, each pulse is received by an associated one of an arrangement of analog differential receivers 620a-620N in the memory device, which may be referred to collectively as differential receivers 620, each of which is connected to an associated one of an arrangement of multiplexers 622, which are individually designated as Mux 1-N. Multiplexers 622 can be addressed by the controller (e.g., by CPU 410 via serial processor section 416 and serial com 418) on a line 624 to provide the desired slice by slice arrangement of data stored in the overall array of memory cells such that drive pulses can program memory cells slice by slice. Corresponding memory addressing can be performed on a line 626. Thus, any suitable memory addressing such as on a slice and/or page basis can be performed by controller 102 via serial com section 418. As discussed above, other suitable combination of memory cells can be selected such as, for example, wordlines and pages.

Write operations to particular kinds of memory cells such as, for example, flash memory cells can be performed in an iterative manner so as to ensure that a targeted amount of charge is, in fact, the amount that is ultimately stored in the memory cell that is being subjected to the procedure. Controller iterate engine 610 can cooperate as part of the processing arrangement to determine (e.g., test) the amount of charge that is actually stored using a read back operation, which in this example is essentially an analog read, and then determines the configuration of another programming pulse that can bring the actual stored charge value up to (e.g., near) the targeted value from some intermediate value. Such an iterative write operation can be performed in a wide variety of ways. In this manner, read back operations and iterations of the write operation can be repeated for any desired number of iterations. For example, a fixed number of iterations may always take place. Each iteration can change (e.g., increase) the stored magnitude by an at least approximately equal amount. As another example, the actual state of the memory cell can be compared to the targeted state to determine (e.g., decide, test, etc.) whether to perform an iterative write operation. Such an iteration and comparison process can be repeated up to some limited number of times. During the iterations, the controller and memory device are essentially transformed between the write configuration of FIG. 6 and the read configuration of FIG. 4 in order to perform iterations of the write operation and readback operations, respectively. Specific details with respect to the operation of the various components of FIG. 6 and signaling considerations will be described at appropriate points below.

Figure 7:
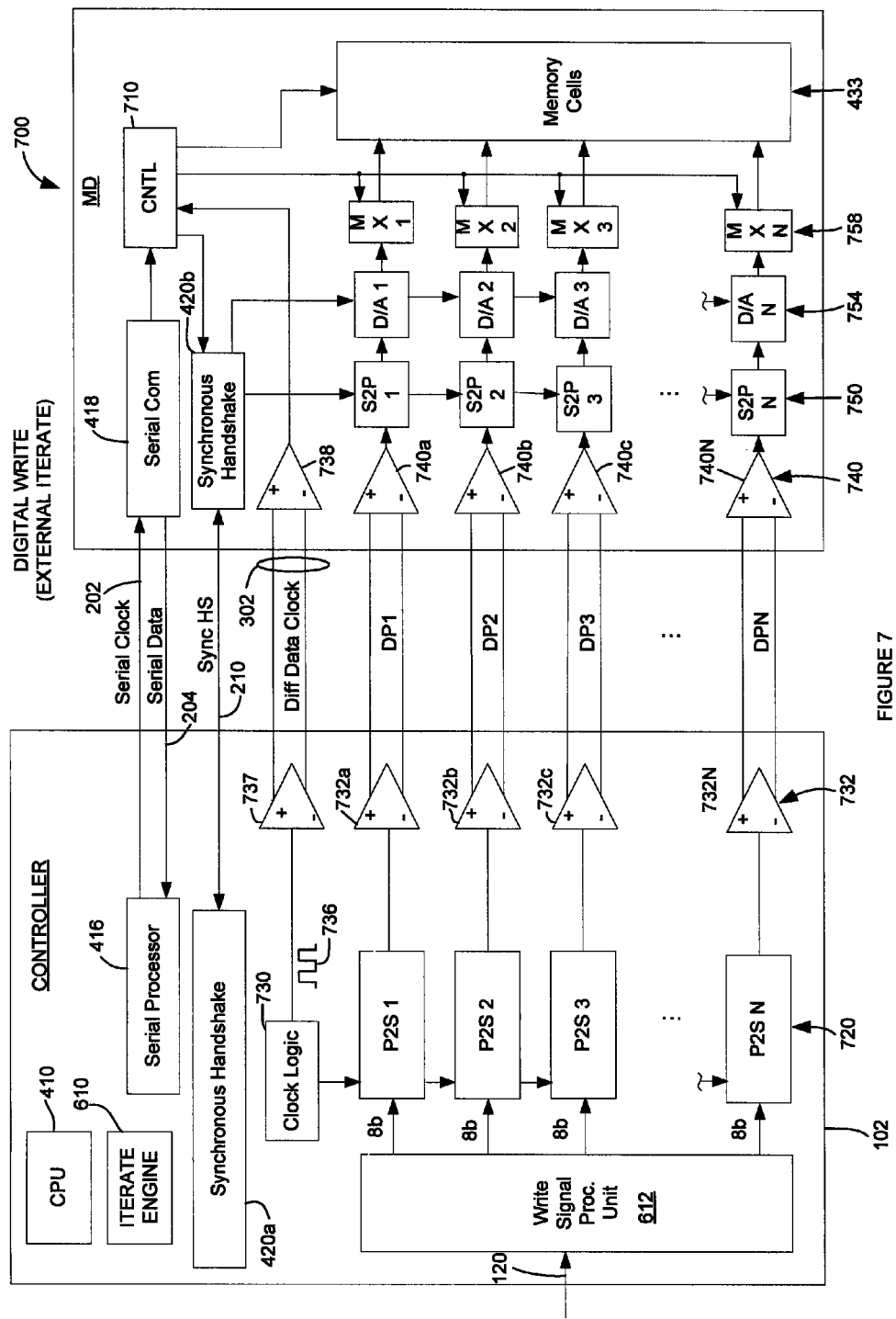
FIG. 7 is a block diagram which illustrates an embodiment of components of the controller of FIG. 3 and an associated memory device for purposes of performing a digital write operation using external iteration.

Referring to FIG. 7, a block diagram is shown which illustrates an overall system, generally indicated by the reference number 700, including an embodiment of controller 102 of FIG. 3 and a representative memory device, MD, in a configuration for performing a write operation by communicating information from the controller to the memory device in the form of digital data. This digital data can be provided based on user data received by write signal processing unit 612. In this instance, controller 102 and memory device MD can be interfaced by an interface such as interface 200' of FIG. 3, with digital data being communicated over the differential pairs. On the controller side, the overall write operation is performed under the control of a processing arrangement that is made up of CPU 410 in communication with iterate engine 610, which will be described in detail below, along with serial processor section 416 and synchronous handshake sections 420a and 420b. On the memory device side, serial com section 418 is interfaced with serial processor 416 on the controller side while synchronous handshake section 420a is interfaced with synchronous handshake section 420b on the memory device side. The serial com section and synchronous handshake section on the memory device side are interfaced with a control (CNTL) section 710 which is also on the memory device side. Control section 710 is further interfaced with multiplexers 758 and memory cell array 433 such that controller 102 can perform any suitable selection in the memory for programming (e.g., write) purposes. It is considered that one having ordinary skill in the art can readily implement these various components in view of this overall disclosure in a wide variety of possible embodiments. As discussed above, interfacing between the processing arrangement and the various components may not be shown for purposes of illustrative clarity, but are understood to be present. Once again, write signal processing unit 612 applies any desired encoding and other operations to the incoming user data such as, for example, convolutional encoding and Reed Solomon encoding. In the present embodiment, the encoded information is then communicated to an arrangement of parallel to serial converters 720, individually designated as P2S 1-P2S N, that can receive write data, for example, in the form of bytes such that eight bit lines extend to each parallel to serial converter. The use of eight bits is selected by way of example and any suitable number of bits can be used by the write signal processing unit to provide (e.g., form) the write data. The latter is then communicated under control of a clock logic section 730 one bit at a time from each one of parallel to serial converters 720 to each one of an arrangement of differential driver amplifiers 732, individually designated by the reference numbers 732*a*-732N which, in turn, individually drive one of differential pairs 1-N.

Clock logic section 730 also provides (e.g., generates) a clock signal 736 which is provided as a differential clock signal on the differential data clock lines by a differential driver amplifier 737. The differential clock signals are received at the memory device by a differential amplifier 738. Signals for differential pairs 1-N are received at the memory device by an arrangement of differential amplifiers 740, individually designated as 740*a*-740N, such that each differential amplifier provides a single-ended output signal. Differential clock signal 736 is provided in single-ended form from differential amplifier 738 to memory cells 433 Differential amplifiers 740, as associated with differential pairs DP 1-DP N, provide output signals to an arrangement of serial to parallel converters 750 that are individually designated as S2P 1-S2P N. Each of these latter serial to parallel converters provides a parallel output (8 bits, in this example) to a respective one of an arrangement of digital to analog converters 754 that are individually designated as D/A 1-D/A N which, in turn, provide outputs to an arrangement of multiplexers 758, individually designated as MX 1-MX N. Responsive to the sync HS signal, each digital to analog converter 754 provides an analog signal to its associated multiplexer responsive to (e.g., based on) the contents of an associated one of the serial to parallel converters. These multiplexers, in turn, can select memory cells within the overall arrangement on a slice by slice basis, as described above. Accordingly, the write data is communicated over the interface bit by bit and converted back into parallel form by the serial to parallel converters in the memory device. The digital to analog converters then convert the parallel digital data to analog signals such that each digital to analog converter can provide a drive signal for the associated memory cell selected by its multiplexer. It should be appreciated that the synchronous handshake signal is directed to the serial to parallel converters as well as the digital to analog converters.

Still referring to FIG. 7, the present embodiment uses an external iterate configuration wherein the iterate engine forms part of the processing arrangement in the controller such that the iteration is performed between the controller and the memory device. Considerations with respect to the iteration process remain unchanged from the discussions above with the only exception here being the communication of write data to the memory device in digital form. The iteration process can be accomplished under control of the iterate engine by toggling, as needed, between the configuration of FIG. 7 to accomplish digital write operations and the configuration of FIG. 5 in order to accomplish digital read operations.

Figure 8:
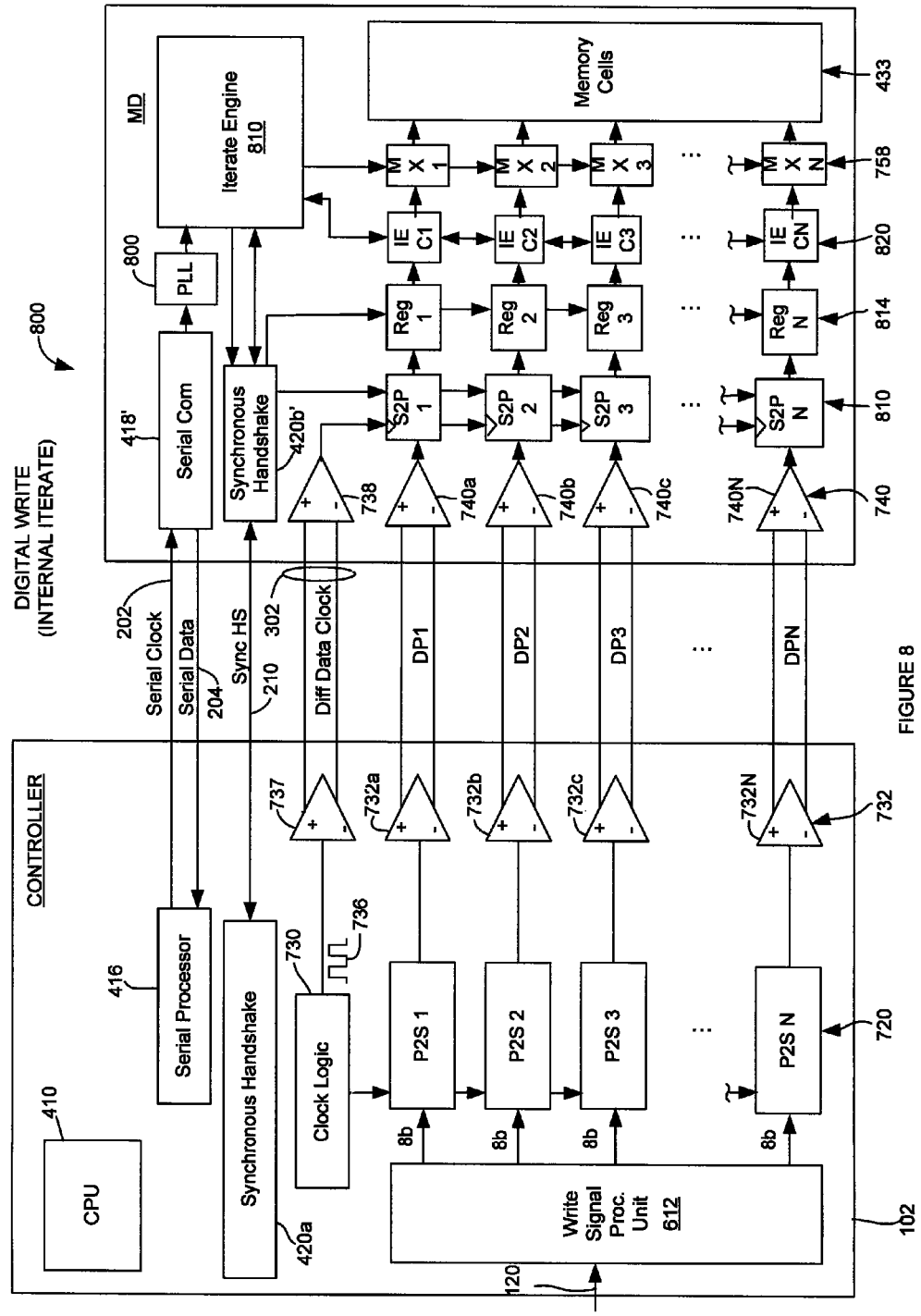
FIG. 8 is a block diagram which illustrates an embodiment of components of the controller of FIG. 3 and an associated memory device for purposes of performing a digital write operation using internal iteration.

Referring to FIG. 8, a block diagram is shown which illustrates an embodiment of an overall system, generally indicated by the reference number 800, including an embodiment of the controller 102 of FIG. 3 and a representative memory device, MD, in a configuration for performing a write operation by communicating information from the controller to the memory device in the form of digital data. Although the present figure, like FIG. 7, illustrates a digital write configuration, FIG. 8 differs in that it embodies an internal iteration configuration. That is, iteration hardware forms part of each memory device, as will be further described below. Accordingly, aside from the absence of the iterate engine, the controller of FIG. 8 appears essentially identical to the controller of FIG. 7.

Still referring to FIG. 8, the overall write operation can be performed under the control of a processing arrangement on the controller side that is made up of CPU 410 in communication with an iterate engine 810 that is now part of the memory device. Serial com section 418' and synchronous handshake section 420*b*' on the memory device side are interfaced with iterate engine 810. It is considered that one having ordinary skill in the art can readily implement these various components in view of this overall disclosure in a wide variety of possible embodiments. As discussed above, interfacing between the processing arrangement and the various components may not be shown for purposes of illustrative clarity but is understood to be present. Again, each differential signal is received at the memory device by a differential amplifier that provides a single-ended output signal. The differential clock signal can be provided to the memory device via differential receiver/amplifier 738 that is connected to the DIFF Data Clock lines to provide a clock input to each one of an arrangement of serial to parallel converters 810, that are individually designated as S2P 1-S2P N and clocked bit by bit using the differential data clock. Each serial to parallel converter 810 also receives the sync HS signal or an appropriate signal that is derived from the sync HS signal to signify that the incoming byte has been received, assuming that data is being handled in a byte-wise manner although this is not required, and to make the received byte available at the output of each serial to parallel converter. The output of each serial to parallel converter 810 is provided to an associated one of an arrangement of registers 814 (8 bit in the present example), that are individually designated as REG 1-REG N. The function of these registers is to store the value that is to be written (e.g., a target value) during the iteration process for reference purposes. Accordingly, during the iteration process, serial to parallel converters 810 can be engaged in receiving the next target values to be stored in the next memory slice. The target values stored by registers 814 are used by an arrangement of iterate engine converters 820, individually designated as IE C1-IE CN such that each of these converters includes a D/A converter for use in the instance of the initial write operation, to provide a voltage that is intended to result in the targeted value in the associated memory cell. In this regard, during the read back operation, the arrows extending from multiplexers 758 to the memory cell arrangement and from iterate engine converters 820 to the multiplexers all reverse directions. During the read back operations in an iterative write operation, each converter 820 (IE C1-IE CN) includes an A/D converter which provides a read back value to iterate engine 810. During the iteration process, iterate engine 810 in cooperation with IE converters 820 can operate, for example, according to the descriptions above. In this regard, it should be appreciated that the iterate engine 810 reads the current state of the memory cell that is currently addressed using the A/D of each IE Converter 820, as will be further described immediately hereinafter.

IE Converter 820 provides outputs to the arrangement of multiplexers indicated as MX 1-MX N. These multiplexers, in turn, can select memory cells within the overall arrangement on a slice by slice basis, as described above. The multiplexers receive address information from serial com section 418' (via, for example, PLL 800 and iterate engine 810) that has been communicated from controller 102 over the serial data interface. Accordingly, multiplexers 758 connect IE Converter 820 D/A sections to memory cells 433 on a slice by slice basis for performing write operations (e.g., iterations of a write operation). It is noted that a phase locked loop (PLL) 830, for example, in conjunction with a well known M and N divider (not separately shown), can be provided as a frequency synthesizer in the memory device. Such a frequency synthesizer receives the serial clock signal from serial com 418' to provide a different frequency clock signal for use by the memory device including the sync handshake section.

Figure 9A:
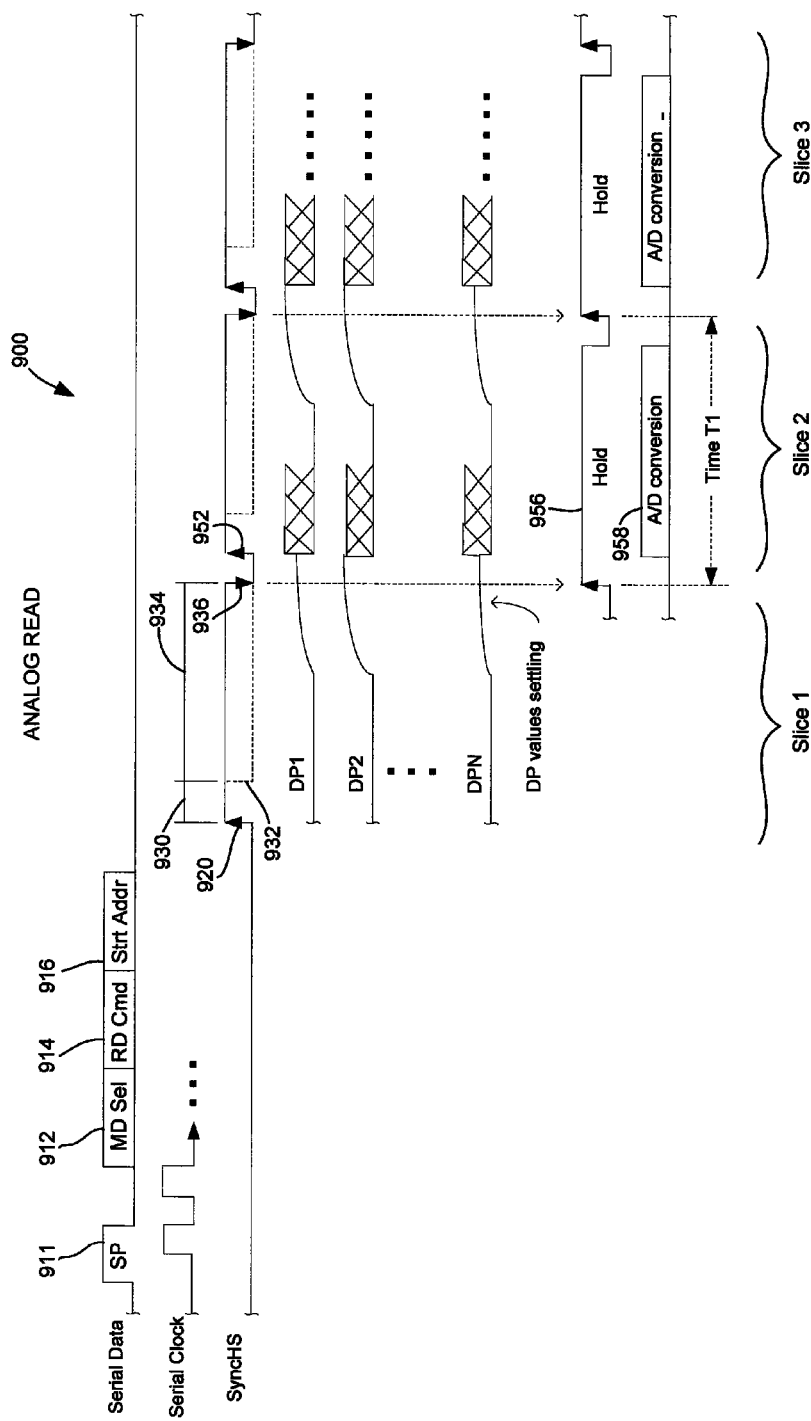
FIG. 9a is a timing diagram which illustrates an embodiment of timing details of an analog read operation using the controller and memory device embodiment of FIG. 2.
Figure 9B:
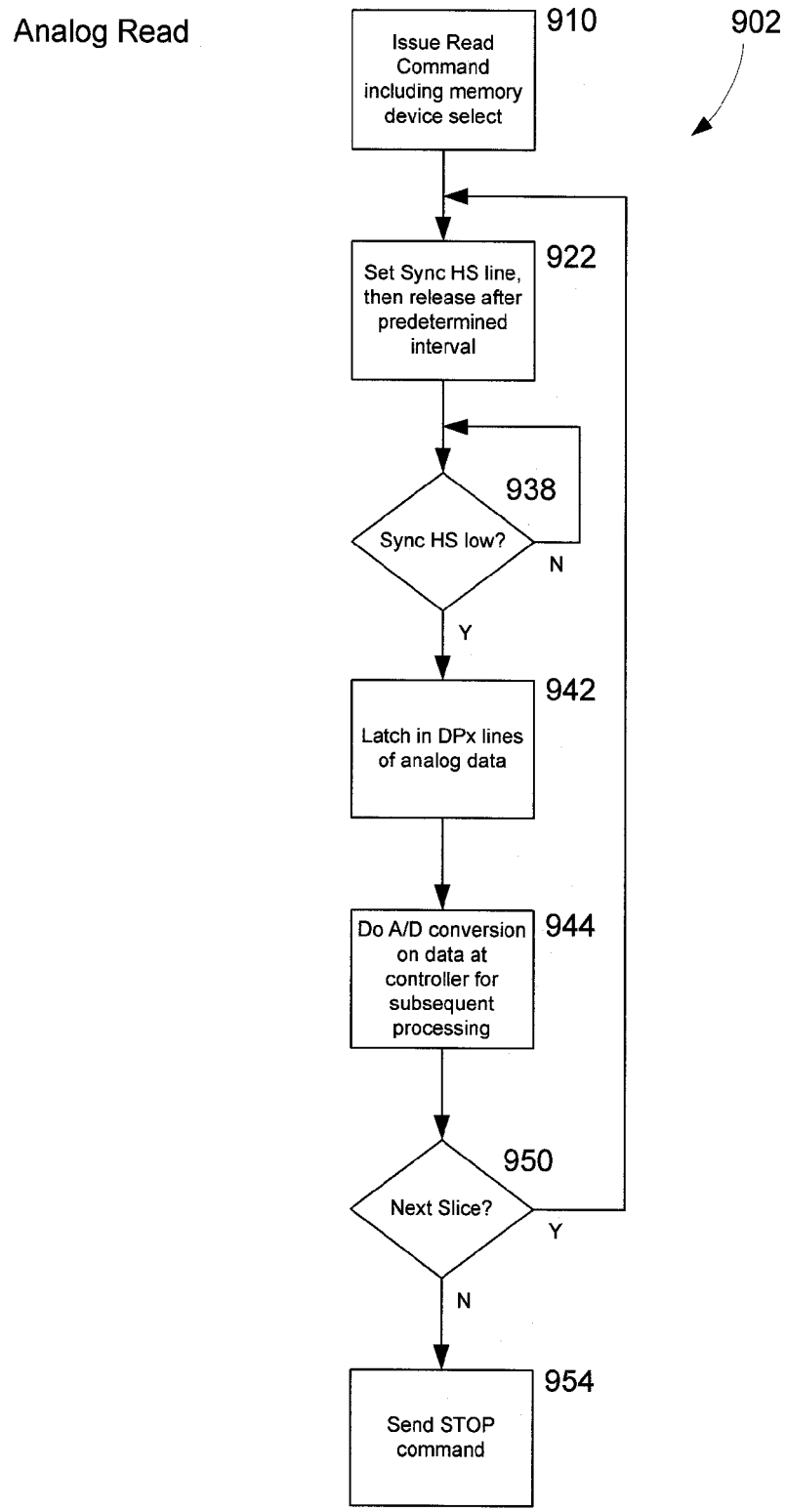

Referring to FIGS. 4, 9a and 9b, attention is now directed to further details with respect to a read operation that is performed using analog data on the differential pairs of FIG. 4. FIG. 9a is a timing diagram, generally indicated by the reference number 900, which illustrates timing aspects of the operation whereas FIG. 9b is a flow diagram, generally indicated by the reference number 902, that accompanies the timing diagram. FIG. 9a illustrates the use of the serial interface including the serial data line and serial clock line. The use and operation of the sync HS line will also be described. Signaling and data carried by other lines is also shown and will be discussed as appropriate. Initially, the controller starts the read operation at 910 by issuing a read command that selects a specific memory device. The controller provides (e.g., places) a start bit (e.g., a pulse) 911 on serial data line 204 and provides a continuous clock signal on serial clock line 202. At an interval following the start pulse, serial data line 204 then carries a memory device select field 912, followed by a read command field 914 and then followed by a start address field 916. These fields may be of any suitable bit length in view of a particular application. Serial com section 418 in each memory device monitors the serial interface. Once one of the memory devices recognizes its device ID in the form of memory device select field 912, that memory device recognizes that it is the target of the current operation and, responsive to read command field 914, recognizes that the operation is a read operation. Controller 102 drives sync HS line 210 for only the selected memory device to an active state (e.g., a high logic state) at a transition 920 (step 922 of FIG. 9b) which causes the identified memory device to set multiplexers Mux 1-Mux N, to address the slice of memory that corresponds to start address field 916. It should be appreciated that the controller is configured to recognize the inactive state on the sync HS line as a prerequisite to driving sync HS to the active state. The arrangement of differential driver amplifiers in the memory device then provides appropriate voltages on differential pairs DP1-DPN, which are shown as settling in FIG. 9a. After driving the sync HS line active (e.g., high) for a particular (e.g., short and predetermined) interval 930 which is sufficient in duration for the selected memory device to recognize the high (e.g., set state), the controller releases this line (indicated using a dashed line 932 in FIG. 9a). Once the identified memory device receives the sync HS transition, however, that memory device drives the sync HS line to the active (e.g., high) state such that the line remains high over an interval 934 until released by the memory device at transition 936. Thus, the memory device is configured for determining whether (e.g., detecting that) sync HS is being driven to the active state by the controller as a prerequisite to the memory device itself driving sync HS to the active state. Once the analog signals have settled on data values carried by the differential pairs, for example, which can be, for example, on the basis of a another particular (e.g., fixed) interval, the memory device drives sync HS inactive (e.g., low). The controller detects the inactive (e.g., low) state of sync HS at step 938 of FIG. 9b. The sync HS section in the controller, in response to this action by the controller, provides a pulse on a begin sample and hold line 940 (FIG. 4) that connects to S/H 1-S/H N in the controller. At step 942 of FIG. 9b, the sample and hold latch the settled values from the differential pairs and provide outputs to analog to digital converters A/D 1-A/D N. Sync HS section 420a at step 944 of FIG. 9b can then provide a pulse on a Begin A/D line 946. In an embodiment, the analog to digital converters can collectively indicate completion of the conversion on an End A/D line 948. The analog to digital converters then provide converted outputs to the read signal processing unit for use in providing user data. For purposes of subsequent discussions, the sync HS line may be described as being driven high or low which is understood to correspond to active and inactive states, respectively, that can be embodied in any suitable manner.

Still referring to FIGS. 4, 9a and 9b, in an embodiment, if another slice is to be read as determined by a next slice test step 950 in FIG. 9b, step 922 then drives the sync HS line high with a transition 952 such that the memory device multiplexers will address the next slice of memory, as shown. For example, responsive to controller 102 via the serial interface and control section 419. Subsequently, the cells of the next slice will be read in a manner that is consistent with the descriptions above. In this manner, any number of memory slices can be read successively. Once step 950 of FIG. 9b determines that no further slices are to be read, at step 954 a stop command is issued. The overall cycle time for a single read operation is indicated as T1 (FIG. 9a) between negative going transitions on the sync HS line. The T1 cycle time includes a hold interval 956 for the sample and holds which overlaps an A/D conversion time 958. A different memory device and/or address can be selected in a subsequent read operation by using the serial interface to transmit another start bit and appropriate fields following the start bit, as described above. It is worthwhile to note that sync HS line 210 allows either the controller or the memory device to throttle the read operation with no loss of synchronization such that each of the controller and the memory device can induce a wait (e.g., paused) condition on the interface until a ready state (e.g., condition) is achieved on both sides of the interface.

Figure 10A:
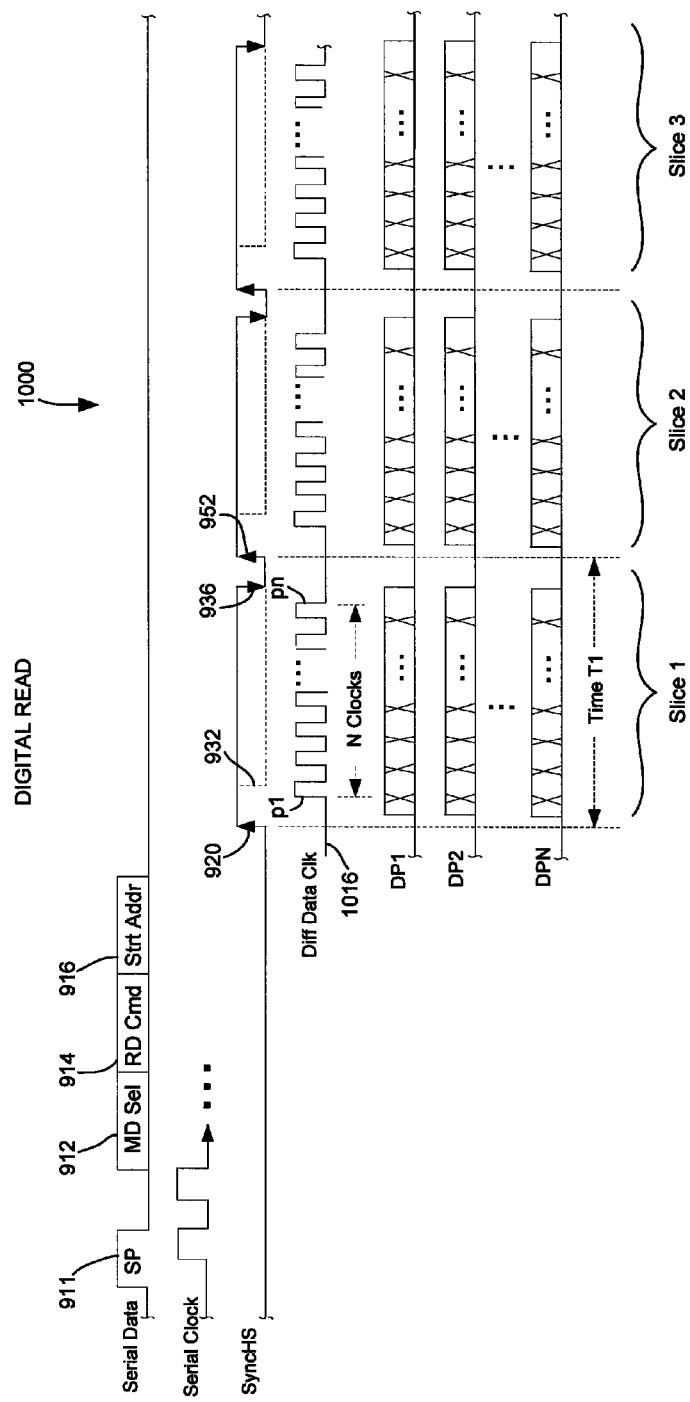
FIG. 10a is a timing diagram which illustrates an embodiment of timing details of a digital read operation using the controller and memory device embodiment of FIG. 3.
Figure 10B:
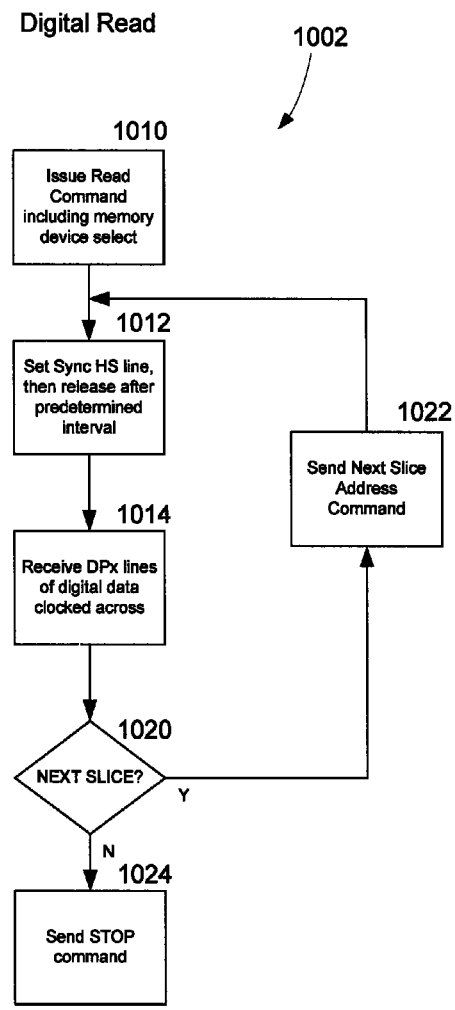

Turning now to a read operation which uses digital information on the differential pairs, attention is immediately directed to FIGS. 5, 10a and 10b. FIG. 10a is a timing diagram, generally indicated by the reference number 1000, which illustrates timing aspects of the operation whereas FIG. 10b is a flow diagram, generally indicated by the reference number 1002, that accompanies the timing diagram. It is noted that the serial interface lines, at least as far as carrying start pulse 911, memory device field 912, read command field 914 and start address field 916, as well as the operation of serial clock line 202 are essentially unchanged with respect to their descriptions in association with the analog read operation of FIG. 9a. For this reason, these descriptions will not be repeated for purposes of brevity. FIG. 10a illustrates an embodiment for the use of the serial communication interface of FIG. 5 including serial data line 204, serial clock line 202 and sync HS line 210. Signaling and data carried by other lines, including the differential pairs, is also shown and will be discussed.

At 1010 in FIG. 10b and responsive to a read command that is issued by the controller, the controller drives sync HS to provide a positive going transition 920 of sync HS which, in turn, causes multiplexers MUX 1-MUX N to select a particular slice of memory to read. As described above and shown in step 1012 of FIG. 10b, the controller initially drives sync HS line 210 high and, after some short interval, releases the sync HS line, as described with regard to FIGS. 9a and 9b. Prior to release of the line by the controller, however, the memory device that has been selected itself drives the sync HS line high. Once the data values from the multiplexers have settled based on reading the memory cells of interest, analog to digital converters A/D 1-A/D N are caused by sync handshake section 420b to latch and convert the analog signal that is received from an associated one of the multiplexers. Once this analog signal has been converted by each of the converters, at step 1014 of FIG. 10b, the associated bit values can be communicated over the interface to the controller in a bit by bit manner under the control of the differential data clock. FIG. 10a illustrates a differential data clock signal 1016 that is associated with the communication of three different slices of data in a sequential manner and which is communicated over differential clock lines 302. Following transition 920 of sync HS signal 210 and availability of converted values from the analog to digital converters, a series of pulses p1-pn is provided on the differential data clock line so as to communicate n bits of data over each differential pair DP1-DPx of the interface for each slice. For example, if eight bit analog to digital converters are used, eight bits of data are communicated. As described above, the data communication takes place through differential buffer amplifiers 520 in the memory device to differential receivers 524 in the controller. Upon arrival at the controller, differential clock signal 1016 causes the bits to be shifted into shift registers Shift Reg 1-Shift Reg N. The timing for the actual value that is provided in the shift register can be responsive to the negative going edge of each differential clock pulse, since there are times on the differential lines indicated by Xs when values can be changing and not particularly stable. Once all of the bits have been communicated subsequent to the final pulse on the differential data clock line, the memory device drives the sync HS line inactive such that negative going transition 936 takes place. Thereafter, read signal processor unit 444 can shift the bits out of shift registers 530 for providing the user data. Controller 102, for example, can monitor a selected number of memory cells to be read such as, for example a slice, and monitor progress of the read operation. In an embodiment, the read operation can be directed to a page which can be made up of a plurality of slices such that step 1020 tracks the progress of the read operation through the slices of the page. Responsive to step 1020 indicating that another slice is to be read, controller 102, via CPU 410 for example, at step 1022 sends a next slice address command to the memory device which specifies that the next slice is to be read. Operation then returns to 1012 which can again drive sync HS line 210 high with positive going transition 952. Multiplexers MUX 1-MUX N are then addressed to the next slice of memory so as to repeat the read operation with respect to this next slice. When, on the other hand, no more slices are to be read at step 1024 the controller sends a stop command. In this way, any number of slices can be read sequentially in a manner that is consistent with the descriptions above. A start bit can be used to initiate any operation that is to be directed to any desired slice.

Figure 11A:
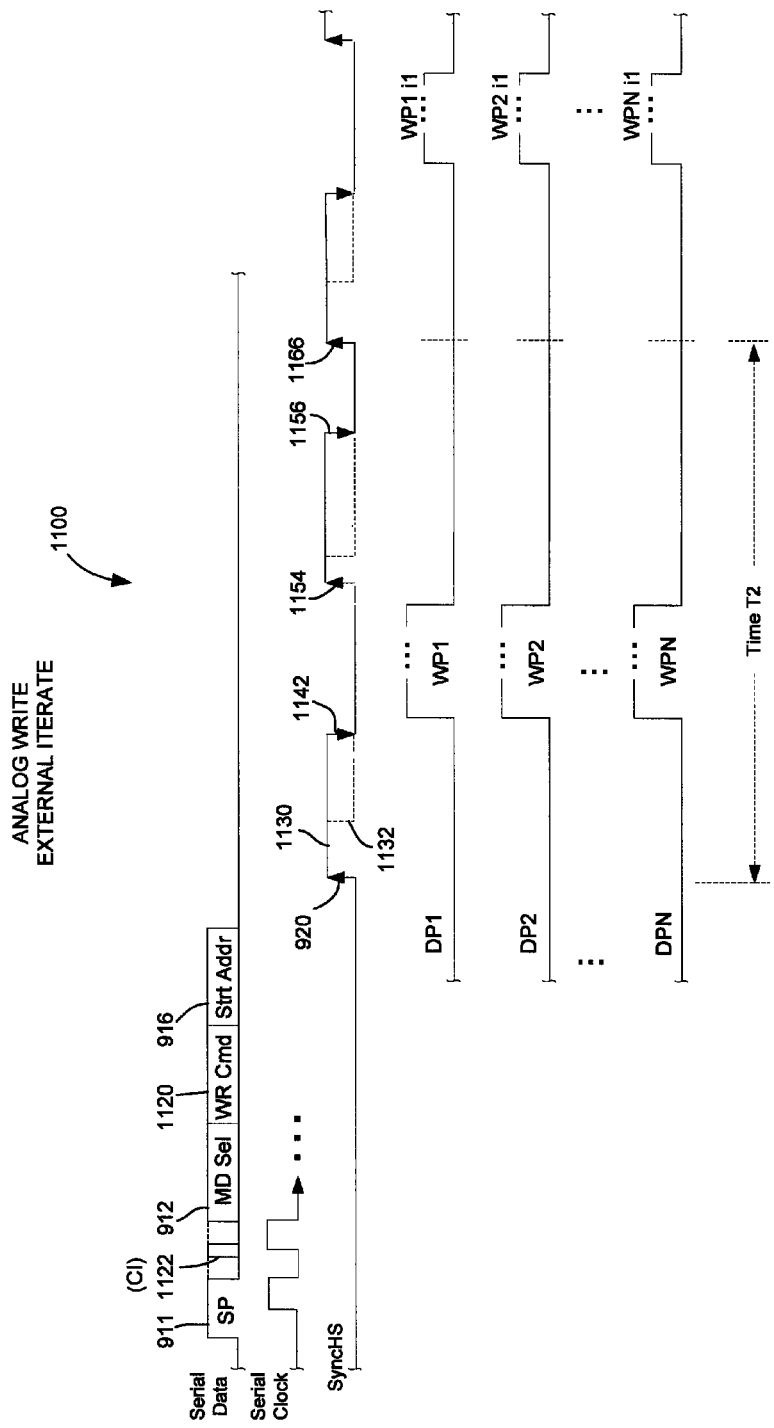
FIG. 11a is a timing diagram which illustrates an embodiment of timing details of an analog write operation using external iteration with the controller and memory device embodiment of FIG. 2.
Figure 11B:
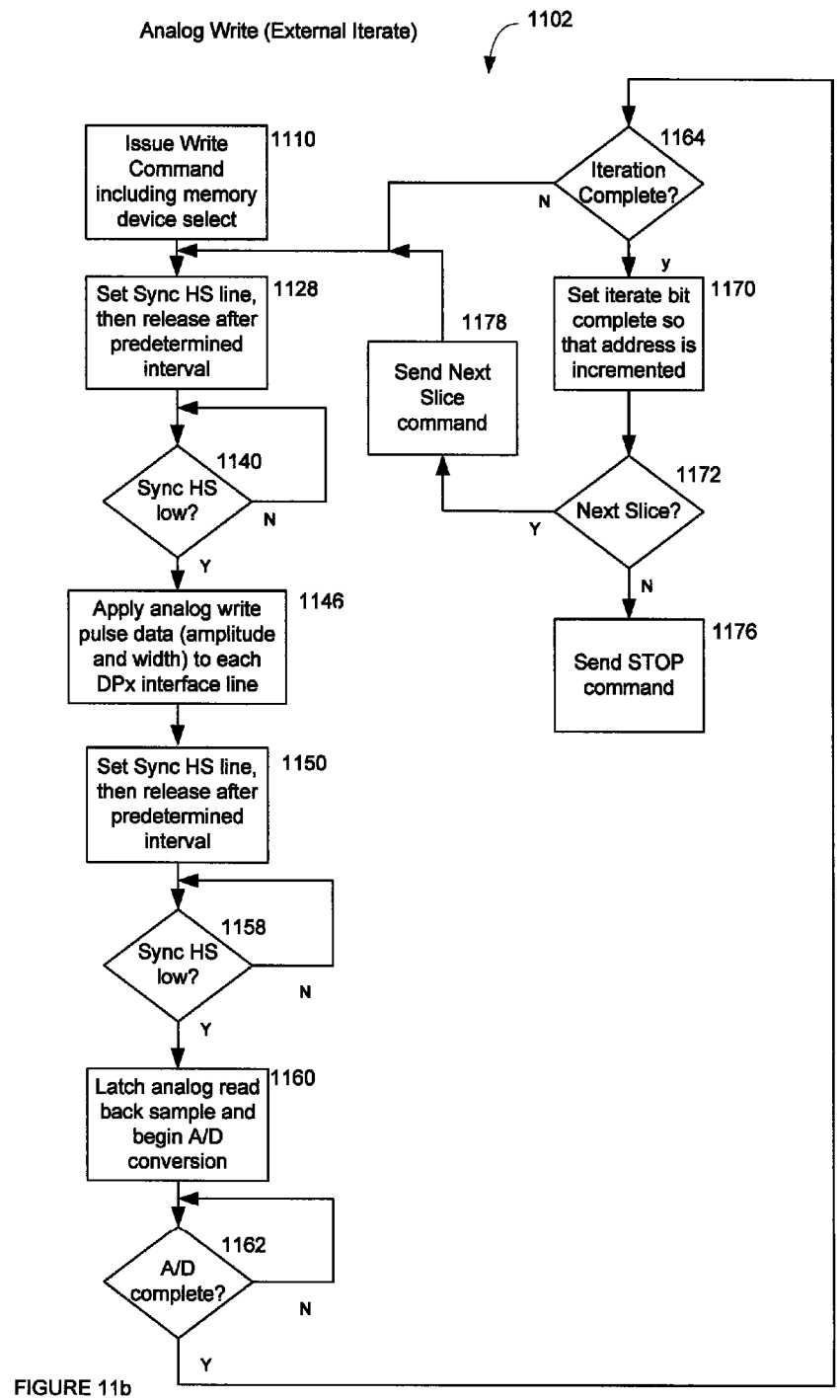

Referring to FIGS. 6, 11a and 11b, attention is now directed to details with respect to an embodiment in which a write operation is performed using analog signals on differential pairs DP1-DPN (i.e., an analog write). In an embodiment, the write command can be directed to writing a page which can be made up of a plurality of slices. Accordingly, a write command can define a write operation that is made up of successively writing a series of slices with a number of write iterations made to each of the slices. While slice-by-slice programming of a page is not required, the present description will employ this framework for purposes of completeness in describing a write operation. FIG. 11a is a timing diagram, generally indicated by the reference number 1100, which illustrates aspects of the timing of the write operation whereas FIG. 11b is a flow diagram, generally indicated by the reference number 1102, that accompanies the timing diagram and illustrates the steps of an embodiment of the procedure. Method 1102 proceeds with an initial issuance in step 1110 of a write command in a manner that is consistent with the read operation as described above using serial data 204 and serial clock 202 lines (FIG. 6), where the serial data line communicates start pulse 911 that is followed by memory device select field 912, followed by a write command field 1120 and then followed by start address 916. It is noted that a Clear Iterate (CI) pulse 1122 can be present in the interval immediately following start pulse 911. If CI is present, the controller is indicating that the operation specified by the current write command is to be directed to a new slice and is not an iteration. Reception of the write command information at the connected memory devices via serial com section 418 of the selected memory device causes the selected memory device to respond to the write command by setting the overall arrangement of multiplexers Mux 1-Mux N to a memory slice that is associated with this start address. User data is received by write signal processing unit 612 and converted to write data, for example, by applying any desired encoding or other operations. The write data is then communicated in parallel form to the arrangement of pulse unit digital to analog converters PU D/A 1-PU D/A N. In the present example, bytes are communicated although any suitable bit width can be utilized. In an embodiment, at step 1128 of FIG. 11b, responsive to positive going transition 920 of sync HS line 210, the pulse unit analog to digital converters begin the conversion process. During this time, the controller maintains (e.g., holds) the sync HS line in a high logic state for a particular interval, such as one of sufficient duration for the selected memory device to determine that sync HS has been driven to active state. At 1132, indicated by a dashed line, the controller releases the sync HS line. The selected memory device then maintains (e.g., drives) the sync HS line in the high logic state until the memory device is ready to receive analog signals over the interface, that are to be directed to the selected memory slice. Responsive to the selected memory device being ready for the write operation, the memory device drives the sync HS line inactive at 1142. Responsive to the transition 1142 of sync HS, as determined by step 1140 of FIG. 11b, the controller, at step 1146 of FIG. 11b, causes pulse unit digital to analog converters 614 to provide programming pulses WP1-WPN on the differential pairs for a memory slice. As described above, these programming pulses are configured in a way that is intended to cause a particular change in a physical state of each memory cell of the current slice that is targeted via multiplexers Mux 1-Mux N.

Having completed the initial write operation iteration, the controller now initiates a read back which can comprise the first step in an iterative write operation that is designed to ensure that, for example, each memory cell of the targeted slice stores the correct (e.g., targeted) amount of charge. It should be noted that the iterative write operation can be controlled (e.g., managed) by iterate engine 610, which forms part of the overall processing arrangement of the controller, such as in order to reduce the processing burden on the CPU. If the CPU has sufficient capacity to control the iterative write operation, however, the CPU itself may be used to do so. In this regard, a considerable degree of design flexibility can be maintained. Read back is initiated by step 1150 of FIG. 11*b* which results in a positive going transition 1154 on the sync HS line and, as in other operations described above, the controller maintains the sync HS line in a high logic state until certain operations are completed. In this case, the configuration of the controller and memory device is converted (e.g., toggled) to the analog read configuration that is previously described above with regard to FIG. 4. Likewise, an analog read operation may be initiated according to FIGS. 9*a* and 9*b* which, in this instance, causes multiplexers MUX 1-N to read the selected slice of memory cells responsive to the selected memory device causing a reset transition 1156 of the sync HS line responsive to the read back information being stabilized for communication to the controller. Step 1158 of FIG. 11*b* monitors sync HS for its release. The controller can then latch, at step 1160, the information on the differential pairs. Step 1162 tests for completion of conversion of the latched values to digital values. The iterate engine (FIG. 6), as described above, can test the values that are read back from the memory cells which make up the memory slice that is currently being addressed at step 1164 to determine if the iterative write operation for the current slice is complete and proceed in a wide variety of different ways, as described above. If the iterative write operation is not complete, the iterate engine causes a positive going transition 1166 on the sync HS line (i.e., execution returns to step 1128) and the controller maintains the line in the high logic state at least until the configuration of the controller and memory device toggle back to the configuration of FIG. 6. Subsequently, iteration continues by directing programming pulses WP 1i1-WP Ni1 to the addressed memory slice at step 1146. This continues until the defined process in the iterate engine is completed with the satisfaction of step 1164. Once the test is passed at 1164, operation proceeds to 1170 which sets clear iterate bit 1122 to cause the next memory slice to be addressed when additional write operations are to be performed. Step 1172 tests for the need to program at least one additional slice. If an additional slice is not specified, operation concludes at 1176 with a stop command issued by the controller. If another slice remains to be written, operation proceeds to step 1178 such that controller 102 sends a next slice command to the controller having clear iterate bit 1172 set and specifying the initial address of the next slice. In this regard, the controller in step 1172 can track the progress of a write operation by counting the number of slices that have been written to the page to determine that all of the slices have been written. The overall cycle time, not including initial slice addressing, but including one write and one read back is indicated as T2 in FIG. 11*a*.

Referring to FIGS. 11*a* and 11*b*, if step 1172 concludes that an additional write operation is to be performed once the iteration on a particular memory slice has been completed, the next successive memory slice can be targeted by the CPU of the controller. As noted, completion of the iterative write operation on the current memory slice can be indicated using a clear iterate bit 1122 that is present in an interval that follows the start pulse and can essentially be an extension of the start pulse over this additional interval. If the clear iterate bit is present, the memory device then can respond to a new start address that can immediately follow and repeat the aforedescribed process starting at step 1128. It is worthwhile to note that sync HS line 210 allows either the controller or the memory device to throttle the read operation with no loss of synchronization such that each of the controller and the memory device can induce a wait (e.g., paused) condition on the interface until a ready state (e.g., condition) is achieved on both sides of the interface.

Figure 12A:
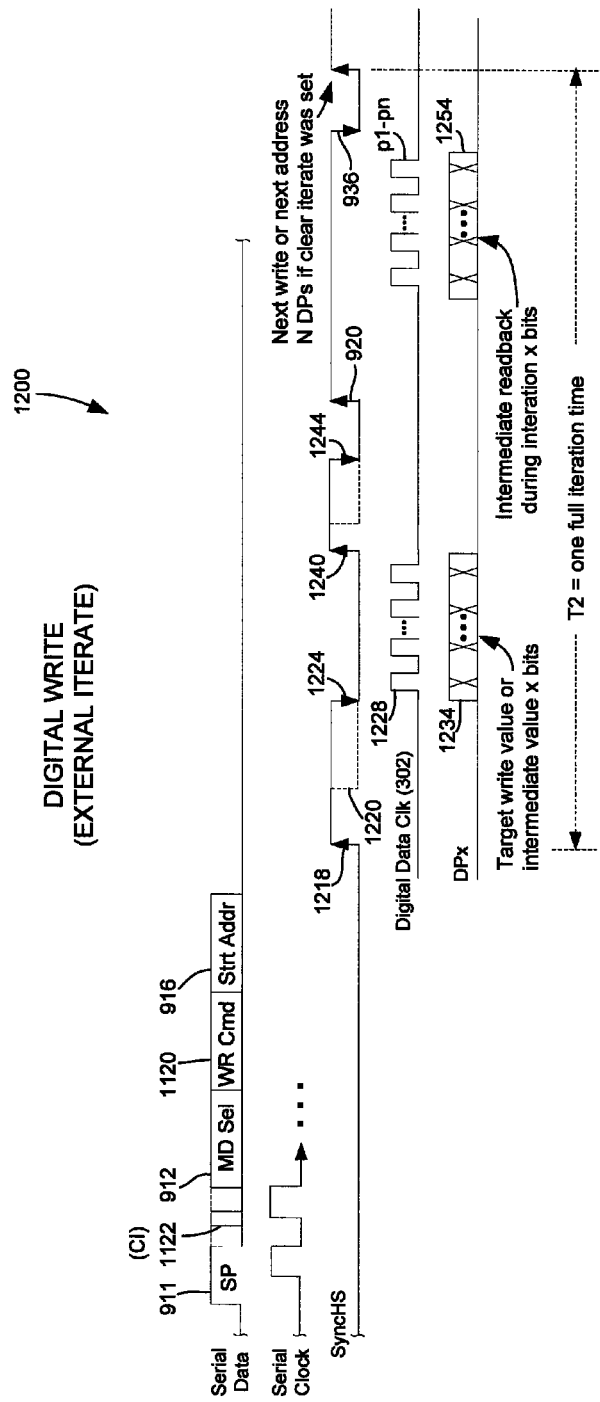
FIG. 12a is a timing diagram which illustrates an embodiment of timing details of a digital write operation using external iteration with the controller and memory device embodiment of FIG. 3.
Figure 12B:
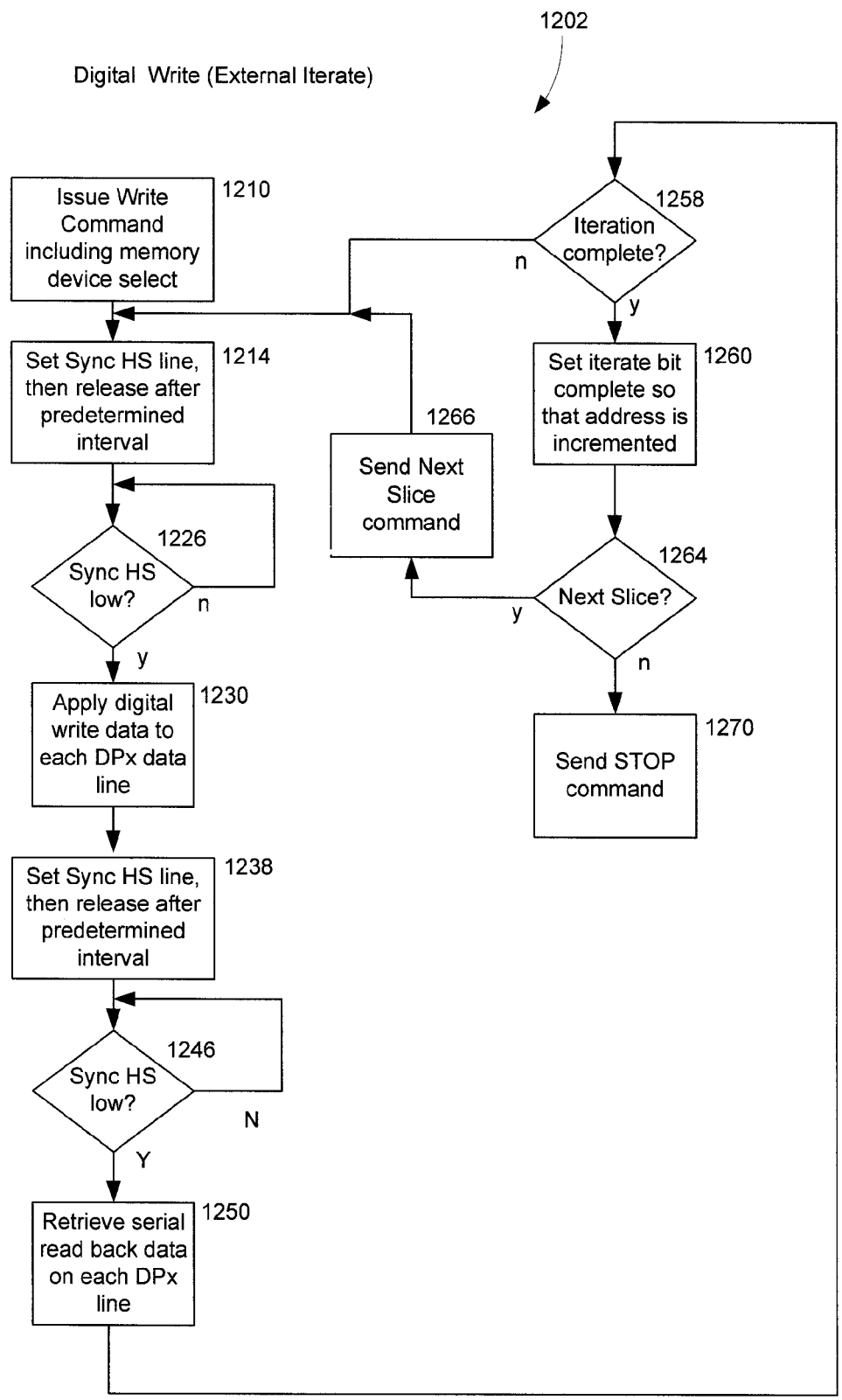

Referring to FIGS. 7, 12*a* and 12*b*, attention is now directed to details with respect to an embodiment in which a write operation is performed using digital signals on differential pairs DP1-DPN (i.e., a digital write) and with external iteration performed in the controller. As is the case with the analog write operation of FIG. 11*b* and in an embodiment, the write command can be directed to writing a page which can be made up of a plurality of slices. While slice-by-slice programming of a page is not required, the present description will employ this framework for purposes of completeness in describing a write operation. FIG. 12*a* is a timing diagram, generally indicated by the reference number 1200, which illustrates timing of the signaling whereas FIG. 12*b* is a flow diagram, generally indicated by the reference number 1202, that illustrates the various steps of an embodiment of the procedure. User data is initially received by write signal processing unit 612 and converted to write data, for example, by applying any desired encoding or other operations. The write operation can begin with the issuance of a write command at step 1210 (FIG. 12*b*) by controller 102 using serial data line 204 and serial clock line 202, where the serial data line communicates start pulse 911, followed by memory device select field 912, followed by write command field 1120 and then followed by start address 916. Reception of this information at the interfaced memory devices causes the selected memory device to respond to the write command by setting multiplexer Mx 1 to the start address which sets the overall arrangement of multiplexers Mx 1-Mx N to a memory slice that is associated with this start address. At the same time, controller CPU 410 initiates communication of the write data from write signal processing unit 612 to set 720 of parallel to serial converters P2S 1-P2S N such that the write data is available for communication over the interface. The write operation is then initiated at step 1214 using a positive going, set transition 1218 on sync HS line 210 with the controller subsequently maintaining the line high and releasing sync HS as indicated by a dashed line 1220 so as to hand off control to the memory device. The selected memory device then holds sync HS line 210 high until the memory device is ready to receive the write value. At this time, the selected memory device releases sync HS to cause a negative going, reset transition 1224 which indicates to the controller that the selected memory device is ready. The reset transition is detected by step 1226. In response, the controller provides a pulse 1228 on differential data clock lines 302 for each set of bits that is to be serially communicated over the interface using the differential pairs, as referred to in step 1230. In the present example, eight pulses are used on the differential data clock line for a byte length data value. It is noted that the differential pairs are generically indicated in FIG. 12*a* using the nomenclature DPx, since essentially the same type of operation is occurring on all of the differential pairs simultaneously. Write data being communicated is indicated at 1234 on DPx. The bytes arrive at the memory device on each differential pair one bit at a time and are clocked into the associated serial to parallel controllers S2P 1-S2P N responsive to the differential data clock. Once the data bytes are present in the serial to parallel converters, the controller at step 1238 initiates another positive going transition 1240 on sync HS line 210 which is handed off to the selected memory device. In response, the selected memory device uses digital to analog converters D/A 1-D/A N to provide analog voltages that are directed to the appropriate memory cells via associated ones of multiplexers MX 1-MX N in order to program each memory cell to a target state (e.g., magnitude). Once the selected memory device completes the write, the memory device drives the sync HS line inactive (transition 1244). Step 1246 monitors the status of sync HS wherein a reset transition indicates to the controller that read back can begin in the context of iteration.

Having completed the initial write operation on the current memory slice, CPU 410 in the controller and responsive to step 1246 can initiate/instruct iterate engine 610 to take over subsequent processing steps, for example, as described above, to continue the iterative write operation. Again, if the CPU has sufficient processing power, it may handle the iterative write operation itself. Operation proceeds by toggling the controller and memory device configuration for a read operation, for example, such as the configuration that is described in conjunction with FIG. 5 and performed further in accordance with FIGS. 10a and 10b. As is also seen in FIG. 12a, the initial read back pulse begins with positive going, set transition 920 by the controller and ends with negative going, reset transition 936. Responsive to pulses p1-pn provided on differential digital data clock line 302, at step 1250, a set of read back bits 1254 is then communicated back to the controller for use by iterate engine 610. The time period for the initial write operation and one read back operation is shown as T2 in FIG. 12a. Step 1258 can then determine, for example, based on the read back operation, if the iterative write operation is complete. In an embodiment, the iterative operation is complete for a given memory cell if a read back value for the given memory cell exceeds a target value. If the process is complete, step 1260 sets clear iterate bit 1122 in the command protocol. Step 1264 then determines whether an additional slice is to be written. If another slice remains to be written, operation proceeds to 1266 causing controller to issue a next slice write command specifying the initial address of the next slice.

Returning to step 1264, operation can then proceed upon receipt of the next slice command at the memory device on the serial data line. Another iterative write operation begins by returning operation to step 1214. It should be appreciated that the next slice command includes a clear iterate bit (i.e., the clear iterate bit is set) to indicate that iteration to the previous slice is complete. This operation continues until the defined process in the iterate engine is completed with the satisfaction of step 1258 for the current slice. Responsive to the next slice command, the memory device can increment its addressing by one slice and the controller initiates an initial slice write operation responsive to the next positive going transition of sync HS provided by step 1214. It should be appreciated that addressing can be incremented by any suitable amount and is not limited to a slice-by-slice embodiment. For example, page size and wordline size can be used. Upon completion of each iteration, step 1264 determines whether another slice remains to be written. If an additional slice write operation is not specified, operation concludes at step 1270 with a stop command issued by the controller, where a new read or write operation can begin responsive to another start pulse, addressing and command information. If an additional write operation is specified, the controller can then continue with the next operation in view of the descriptions above.

Figure 13A:
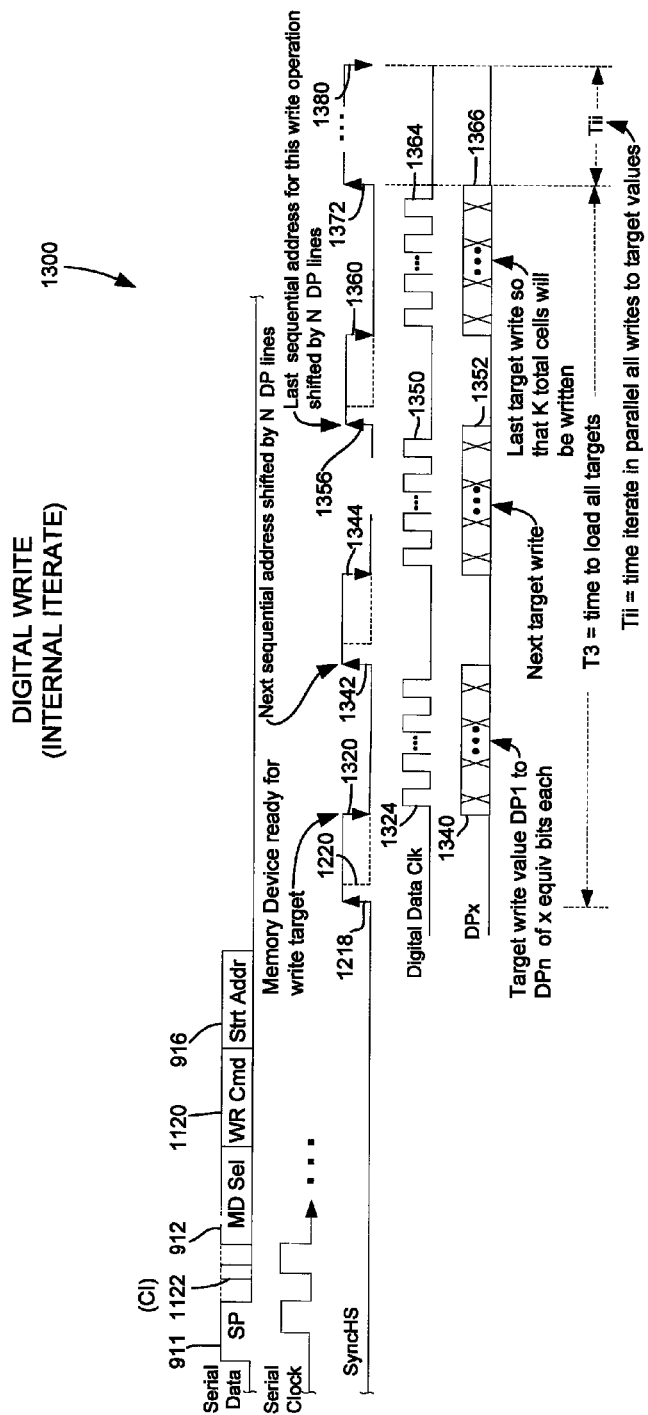
FIG. 13a is a timing diagram which illustrates an embodiment of timing details of a digital write operation using internal iteration with the controller and memory device embodiment of FIG. 3.
Figure 13B:
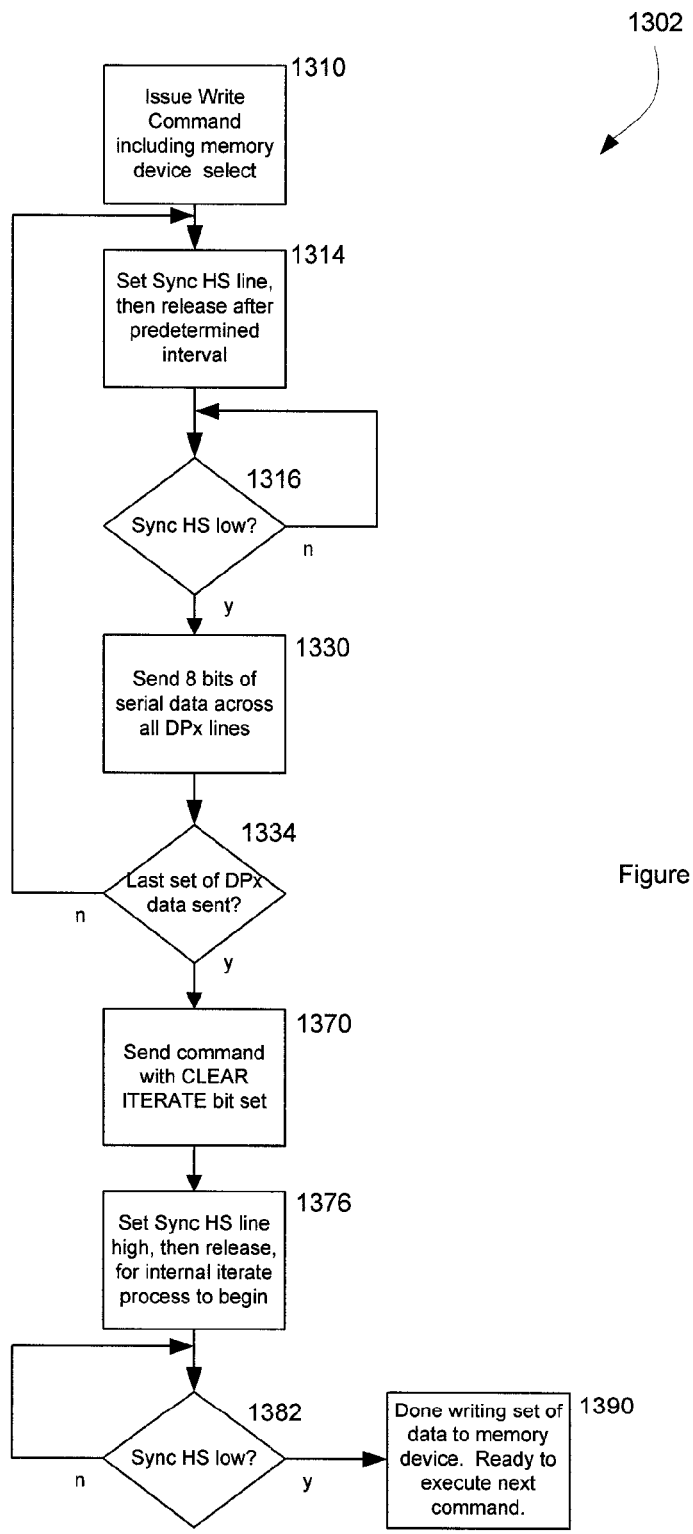

Referring to FIGS. 8, 13a and 13b, attention is now directed to details with respect to an embodiment in which a write operation is performed using digital voltages on the differential pairs and with iteration performed internal to the memory device (i.e., an internal iterate configuration). FIG. 13a is a timing diagram, generally indicated by the reference number 1300, which illustrates timing of the signaling and data flow whereas FIG. 13b is a flow diagram, generally indicated by the reference number 1302, that illustrates the various steps of an embodiment of the procedure. User data is initially received by write signal processing unit 612 and converted to write data, for example, by applying any desired encoding or other operations. The write operation can begin at step 1310 of FIG. 13b in a manner that is consistent with the read operation as described above using serial data line 204 and serial clock line 202, where the serial data line communicates start pulse 911 that is followed by a memory device select field 912, followed by write command field 1120 and then followed by start address 916. Reception of this information at the connected memory devices causes the selected memory device to respond to the write command by iterate engine 810 of the selected memory device ultimately taking control of the operation, at least as far as handling the internal iteration operation in the selected memory device, and setting multiplexer Mx 1 to the start address, which involves setting the overall arrangement of multiplexers Mx 1-Mx N to a memory slice that is associated with this start address. At substantially the same time, controller CPU 410 initiates communication of the write data from write signal processing unit 612 to the arrangement 720 of parallel to serial converters P2S 1-P2S N such that the write data is available for communication over the interface. As illustrated in step 1314 of FIG. 13b, the write operation is then initiated using positive going transition 1218 on sync HS line 210, where the controller releases sync HS, as indicated by dashed line 1220, after a particular time interval (which need only be of sufficient duration so as to allow the memory device to take temporary control of the sync HS line). The selected memory device then maintains the sync HS line high until it is ready to receive the write data. Step 1316 of FIG. 13b monitors the status of the sync HS line. If the selected memory device drives the sync HS line inactive (negative going transition 1320), this indicates to the controller that the selected memory device is ready. In response, the controller provides a pulse 1324 on the differential data clock line for each set of bits that is to be serially communicated over the interface using the differential pairs, with the serial communication of the write data being accomplished by looping through steps 1314, 1316, 1330 and 1334 until the last step determines that all of the sets of bits have been communicated. In the present example, eight pulses are required on the differential data clock line for a byte length data value. It is noted that, as in FIG. 12a, the differential pairs are generically indicated using the nomenclature DPx, since essentially the same type of operation is occurring on all of the differential pairs simultaneously. Write data being communicated is indicated at 1340 on DPx. The bytes arrive at the memory device on each differential pair one bit at a time and are clocked into the associated serial to parallel controllers S2P 1-S2P N responsive to the differential data clock. Once the data bytes are present in the serial to parallel converters, the data bytes are communicated to respective ones of registers Reg 1-Reg N for reference purposes, yet to be described. In this regard, it should be appreciated that a series of write operations can be performed by this embodiment, followed by an iteration process that is directed to all of the memory cells that were subject to a write operation, wherein the collective result comprises a series of iterative write operations. The registers, therefore, store the target write value that is associated with each of these memory cells at least until those memory cells have been subjected to the iteration process. Once target write values are present in the registers for a memory slice, the iterate engine can write that value to the targeted memory slice via the IE converters 820, such as by providing analog voltages that are routed through multiplexers MX 1-MX N.

Following the first write operation, the controller initiates another positive going transition 1342 on the sync HS line which is handed off to the selected memory device. In response, the selected memory device increments the addressing of multiplexers MX 1-MX 3 by one memory slice and uses I/E converters 820 to provide analog voltages corresponding to that slice in order to program memory cells of the next slice. The selected memory device indicates that it is ready by driving the sync HS line inactive (negative going transition 1344). The write data for the current slice is communicated by the controller using a set of pulses 1350 on the digital data lines that are associated with data values 1352. A subsequent positive going transition 1356 of sync HS indicates to the selected memory device that values for the next incremental memory slice will be communicated. The selected memory device indicates that it is ready by driving sync HS inactive at 1360 such that pulses 1364 are used to communicate data 1366 on the differential pairs. While the present example illustrates writing of three memory cell slices, it should be appreciated that this process can continue in slice by slice increments until communication of some desired amount of write data has been accomplished.

Having completed the initial write operations on the targeted memory slices, the CPU in the controller can initiate/instruct the iterate engine to take over subsequent processing steps, for example, as described above, to begin the iteration process. Iteration can begin, for example, at 1370 in FIG. 13b responsive to the controller sending a command with a Clear Iterate bit 1122 set for purposes of specifying the next memory slice for which target values are to be transferred. In this regard, sync HS is then set by a transition 1372 (FIG. 13a) in step 1376 (FIG. 13b) by the controller and then released for subsequent control by the iterate engine. Operation can proceed by the iterate engine in the selected memory device initiating a read back from each memory cell of the targeted memory cells. In doing so, the iterate engine can use IE Converters 820 in conjunction with MX 1-MX N. The controller and selected memory device configuration can then return to that of FIG. 8 such that the determined iterate data values can be written to the targeted memory cell slices in a manner that is essentially identical to the manner in which the initial write values were written to those targeted memory cell slices under control of the internal iterate engine. This iteration interval is indicated as Tii in FIG. 13a while an interval T3 indicates the time for a write operation to the memory cells of the targeted slices. The iteration can continue with another read back and write operation at the discretion of the iterate engine. Completion of the iteration is indicated to the controller at 1380 when sync HS is reset by the iterate engine. Step 1382 of FIG. 13b monitors sync HS to determine whether iteration is complete. If complete, the controller is placed into a state at step 1390 where it is ready to execute a next command, wherein operation can proceed upon receipt of another start pulse on the serial data line.

Figure 14:
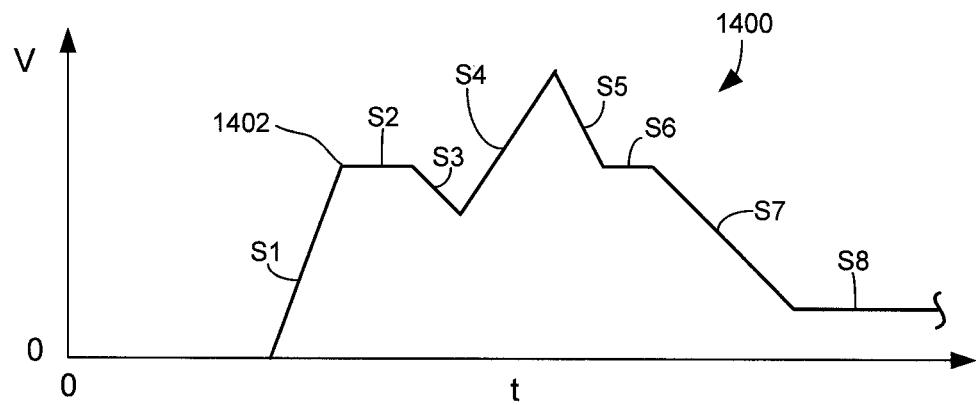
FIG. 14 is a plot of voltage versus time illustrating an embodiment of a programming pulse having piecewise linear segments.

Referring now to FIG. 14, a programming (write) pulse is generally indicated by the reference number 1400 on a plot of voltage versus time. As discussed above, a programming pulse can be configured (e.g., customized) to have a pulse shape that is configured to cause a particular (e.g., intended) change in a state of a particular memory cell (e.g., a value of a physical parameter of the memory cell). In an embodiment, the pulse shape can be based on a target value for the physical parameter. Moreover, the pulse shape can be customized based on the particular type of memory cell being programmed. Accordingly, pulse 1400 includes a starting value (e.g., magnitude) and an ending value with a defined shape therebetween. The defined shape can be specified as a change in magnitude as a function of time (i.e., a slope). It should be appreciated that pulse 1400, when directed to the particular memory cell, exhibits a pulse value that can represent current, voltage, power or any suitable metric which can be used to program a memory cell. In an embodiment, the pulse can be employed as a single programming pulse. In another embodiment, the pulse can be one programming pulse in a series of pulses for completing a programming sequence such as, for example, an iterative write operation.

In an embodiment, pulse 1400 can be characterized as a series of piecewise linear segments. In the present example, eight segments S1-S8 are shown. A first segment S1 can be a leading edge of the pulse. Each segment can be characterized as having a starting value (e.g., magnitude), a slope and an ending value. The ending value can be the same as the starting value (e.g., a zero slope) or a different value that is greater or less than the starting value (such that a segment can have either a positive or negative slope). In the present example, S1 starts at zero volts and exhibits a positive slope. Each segment can also be characterized by a time duration which is useful for zero slope segments, for example. Each successive segment starts at the endpoint of the previous segment. For example, segment S2 starts at a point 1402 where segment S1 ends. Thus, segment S1 can be characterized in one way by a starting value, an ending value and a slope. Segment S1 can be characterized in another way by a starting value, an ending value and a time duration. A flat (zero slope) segment can be characterized by a starting value and a time duration. In view of the foregoing, using a suitable number of segments, a wide range of pulse shapes can be created. It is noted that pulse 1400 has been illustrated with 8 initial segments to illustrate the capabilities of the present method with respect to providing complex pulse shapes.

Figure 15:
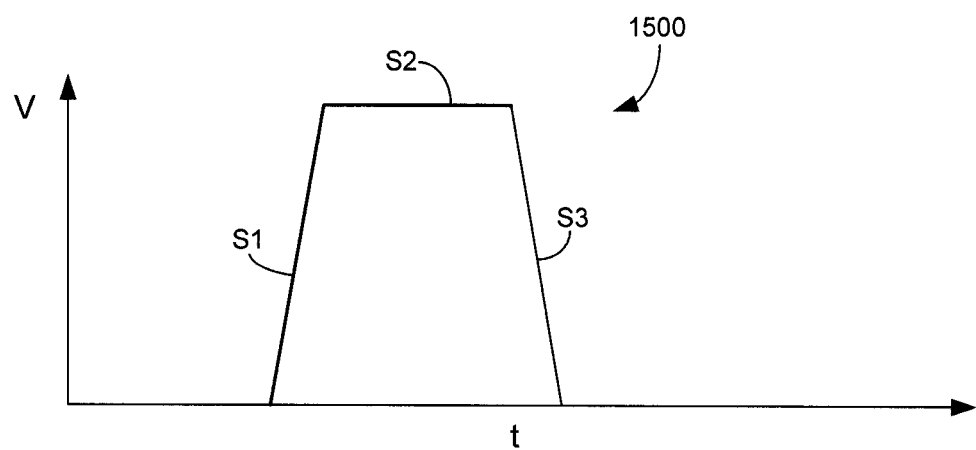
FIG. 15 is a plot of an embodiment of a programming pulse having three piecewise linear segments.
Figure 16:
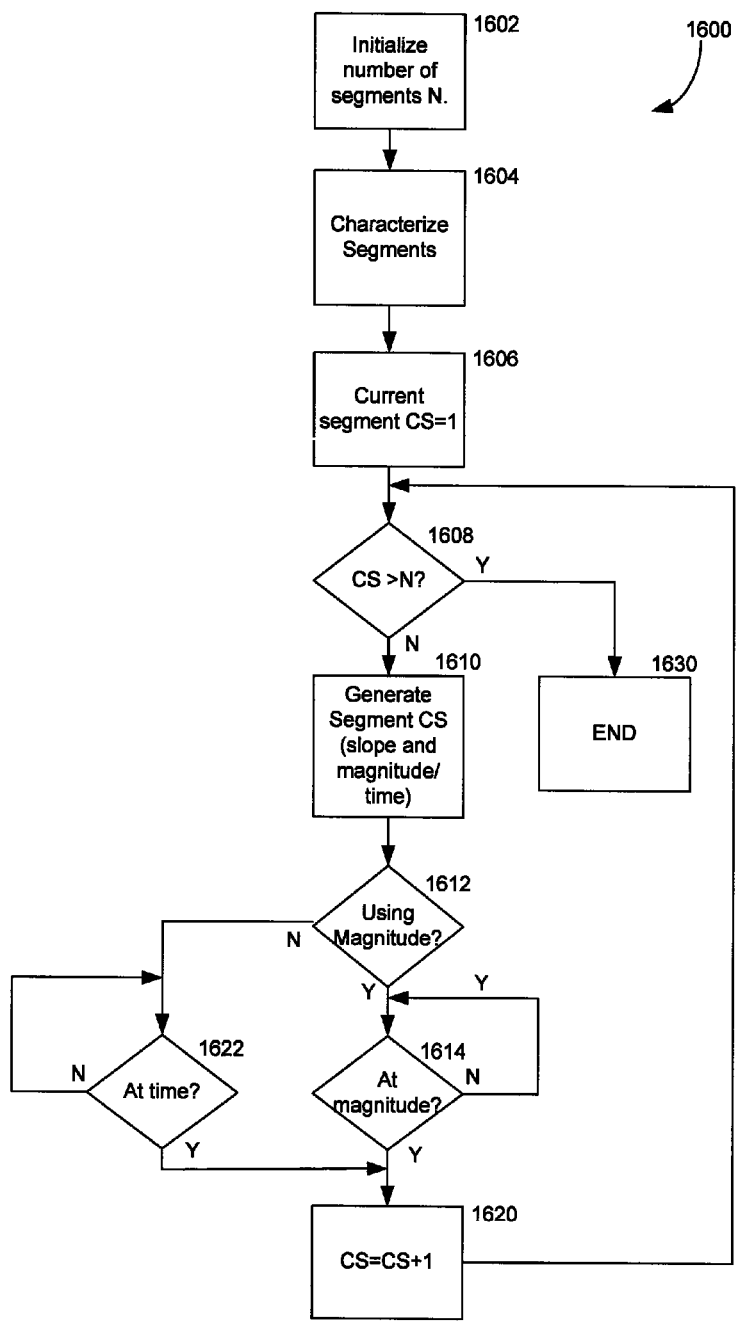
FIG. 16 is a flow diagram illustrating an embodiment of a method for providing the programming pulses of FIGS. 14 and 15.

Referring to FIGS. 15 and 16, the former illustrates a programming pulse 1500 having three segments S1-S3 for descriptive purposes, shown on a plot of magnitude (e.g., voltage) versus time. Segment S1 represents a leading edge, segment S2 represents a middle segment and segment S3 represents a trailing edge. FIG. 16 is a flow diagram illustrating an embodiment of a method, generally indicated by the reference number 1600, for providing a desired programming pulse shape using piecewise linear segments. It should be appreciated the slopes of S1 and S3 have been exaggerated for illustrative purposes. Based on pulse 1500, step 1602 of FIG. 16 is initialized with N=3 as the number of segments. At 1604, each segment is characterized. By way of example, pulse 1500 is assumed to have a leading edge extending from 0 volts to 3 volts in 100 nanoseconds, a zero slope peak of 3 volts for 10 microseconds corresponding to segment S2, and a trailing edge from 3 volts to 0 volts in 50 nanoseconds corresponding to segment S3. Accordingly, at 1604, each segment can be characterized according to Table 1 as:

TABLE 1

| Segment no. | Start value | End value | Duration | Slope |
|---|---|---|---|---|
| S1 | Zero v | 3 v | X | 30e6 v/sec |
| S2 | 3 v | x | 10 us | 0 v/sec |
| S3 | 3 v | 0 v | X | −60e6 v/sec |

X = not specified

At 1606, the current segment is set to S1. At 1608, the number of the current segment is compared to N, which was previously set to 3. If the number of the current segment is less than N, operation proceeds to 1610 to provide segment S1. The pulse begins ramping at 30e6 volts/sec (30 million volts/second) up from zero volts. Step 1612 determines whether the parameter settings for the current segment rely on using a magnitude (e.g., end value of voltage) to establish the endpoint of the segment. In the case of segment S1, the segment is characterized by an end value of 3 volts. Accordingly, operation proceeds to 1614 which determines whether the specified end value has been reached (e.g., whether the voltage of the pulse segment is at the end value). Upon 1614 determining that the pulse segment is at the end value of 3 volts, operation moves to 1620 which increments the Current Segment value by one. Operation then returns to 1608 which compares the Current Segment value, which is now equal to 2, to N, which is equal to 3. Since the current segment value is not greater than N, operation moves to 1610 to provide segment S2. This latter segment is characterized by a start value, a duration and a slope, as seen in Table 1. Accordingly, step 1612 determines that the end of the segment is not being established using magnitude and directs operation to 1622. Step 1622 determines whether a time duration of the current segment being reached, which in the case of S2 is 10 microseconds. Once the segment duration is reached operation proceeds to step 1620 which increments the Current Segment value to 3. Operation returns to 1608 to compare the Current Segment value of 3 to N, also having a value of 3. Since the Current Segment value is not greater than N, operation proceeds to 1610 which provides segment S3. Segment S3 is characterized by a start value, an end value and a slope. Accordingly, from the endpoint of S2 a segment having a negative slope of −60e6 volts (minus 60 million volts/second) is provided. Since the end value of S3 is characterized by a magnitude of zero volts, operation proceeds from 1612 to 1614. Once the end value of zero volts is reached, operation proceeds to 1620, which increments the Current Segment value to 4. At 1608, the Current Segment value is greater than N, such that operation ends at 1630. By applying this method, pulses of any suitable shape can be provided using piecewise linear segments. It should be appreciated that method 1600 can be embodied in, for example, Pulse Unit D/A converters 614 of FIG. 6.

Referring to FIGS. 14-16, a programming pulse shape can change from one nonvolatile memory technology to another. Further, material changes over time in a given technology such as, for example, phase change memory can result in the use of different programming pulse shapes. Moreover, in an iterative write operation, the pulse shape can change from one programming pulse iteration to the next. Using phase change memory by way of non-limiting example, for a given target state being programmed, the first programming pulse can encounter a resistance level in a particular cell resulting from a reset state (e.g., amorphous and high resistance). The initial pulse can melt the amorphous material to cause the material to exhibit higher electrical conductance (e.g., a now partially crystalline state). Additional pulses of different shapes can then be applied iteratively to converge on the target state (e.g., the target resistance), with each pulse being different, based for example, on how close the current state is to the target state, and/or whether the current resistance of the cell, for example, should be increased or decreased.

The foregoing description of the invention has been presented for purposes of illustration and description. It is not intended to be exhaustive or to limit the invention to the precise form or forms disclosed, and other modifications and variations may be possible in light of the above teachings wherein those of skill in the art will recognize certain modifications, permutations, additions and sub-combinations thereof.

What is claimed is:

1. A controller configured to interface with a separate memory device and perform an iterative write operation to program a selected memory cell of the memory device to a target state, wherein each iteration of the write operation is configured to successively change a physical state of the selected memory cell and the controller is configured to interface with the memory device over a serial communication interface including a sync handshake line and wherein the controller is configured to throttle each iteration of the write operation by signaling on the sync handshake line.

2. The controller of claim 1, wherein the controller is configured to determine the physical state of the selected memory cell after an iteration of the write operation and configure a next iteration of the write operation responsive to the determined physical state of the selected memory cell.

3. The controller of claim 2, wherein the controller being configured to configure the next iteration of the write operation comprises the controller being configured to configure a next programming pulse.

4. The controller of claim 1, wherein the iterative write operation comprises a fixed number of iterations.

5. The controller of claim 1, wherein the controller is further configured to compare the physical state of the selected memory cell to the target state.

6. The controller of claim 1 wherein each iteration of the write operation is configured to incrementally change a physical value.

7. The controller of claim 6 wherein each iteration of the write operation is configured to increment the physical value by an at least approximately equal amount.

8. The controller of claim 7 wherein the controller is configured to increment the physical value until the physical value is within a particular range associated with the target state.

9. The controller of claim 7 wherein the controller is configured to read back the physical value after each iteration of the write operation.

10. The controller of claim 1 wherein the controller is configured to establish two or more levels of the physical value in each memory cell of the nonvolatile memory.

11. The controller of claim 1 wherein each iteration of the write operation is configured to cause charge to be stored in the selected memory cell.

12. The controller of claim 11 wherein the iterative write operation is configured to successively increase a magnitude of the charge stored in the selected memory cell until the charge magnitude is within a particular range associated with the target state.

13. The controller of claim 12, wherein the controller is configured to interface with a plurality of memory devices.

14. The controller of claim 1 wherein the controller is configured to interface with the memory device using a digital interface.

15. The controller of claim 1 wherein the controller is configured to interface with the memory device using an analog interface.

16. The controller of claim 1 wherein the controller includes a processing arrangement that is configured to control the iterative write operation.

17. The controller of claim 16, wherein the processing arrangement includes an iterate engine.

18. The controller of claim 17, wherein the processing arrangement further includes a processor in communication with the iterate engine.

19. The controller of claim 16, wherein the processing arrangement includes a processor.

20. The controller of claim 1 wherein the selected memory cell is one memory cell of a page of memory cells and the iterative write operation is configured to program each memory cell of the page of memory cells substantially simultaneously.

21. The controller of claim 20 wherein the page of memory cells is one page of a plurality of pages of memory cells, and the controller is configured to program each page of the plurality of pages successively.

22. The controller of claim 21 wherein each page of the plurality of memory pages is sequentially addressable and the controller is configured to increment an initial page address to access sequential ones of the plurality of memory pages.

23. The controller of claim 1, wherein the controller is configured to interface with the memory device using, at least in part, a serial communication interface.

24. The controller of claim 23 wherein the controller is configured to communicate a clear iterate bit on the serial communication interface to indicate completion of the iterative write operation.

25. The controller of claim 1, wherein signaling on the sync handshake line by the controller throttles a read operation.

26. The controller of claim 1, further comprising:
- a synchronous handshake section to provide a drive signal; and
- a pulse unit digital to analog converter configured to provide a programming pulse responsive to received write data and the drive signal, wherein the programming pulse has a pulse shape configured responsive to the target state of the selected memory cell.

27. In a controller that is configured to interface with a separate memory device, a method comprising:
- performing an iterative write operation to program a selected memory cell of the memory device to a target state, wherein each iteration of the write operation is configured to successively change a physical state of the selected memory cell; and
- interfacing with the memory device over a serial communication interface including a sync handshake line to throttle each iteration of the write operation by signaling on the sync handshake line.

* * * * *